US012803602B2

(12) United States Patent
Tanaka

(10) Patent No.: US 12,803,602 B2
(45) Date of Patent: Nov. 17, 2026

(54) RADIO FREQUENCY MODULE AND COMMUNICATION DEVICE

(71) Applicant: Murata Manufacturing Co., Ltd., Nagaokakyo (JP)

(72) Inventor: Rui Tanaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 177 days.

(21) Appl. No.: 18/954,580

(22) Filed: Nov. 21, 2024

(65) Prior Publication Data

US 2025/0300682 A1 Sep. 25, 2025

(30) Foreign Application Priority Data

Mar. 22, 2024 (JP) ................................ 2024-047288

(51) Int. Cl.
*H04B 1/04* (2006.01)
*H05K 1/02* (2006.01)

(52) U.S. Cl.
CPC ............. *H04B 1/04* (2013.01); *H05K 1/0218* (2013.01); *H05K 1/0243* (2013.01); *H04B 2001/0408* (2013.01)

(58) Field of Classification Search
CPC .............. H04B 1/04; H04B 2001/0408; H05K 1/0218; H05K 1/0243; H05K 3/4046; H05K 1/165; H05K 3/3442; H05K 3/284; H05K 2201/0715; H05K 2201/1006; H05K 2201/10242; H05K 2203/025; H05K 2201/10265; H05K 2201/10287; H05K 2203/1327; B33Y 10/00
See application file for complete search history.

(56) References Cited

U.S. PATENT DOCUMENTS

| | | | | |
|---|---|---|---|---|
| 12,519,492 B2 * | 1/2026 | Ono | ..................... | H04B 1/0078 |
| 2010/0230789 A1 * | 9/2010 | Yorita | ..................... | H05K 3/284 257/659 |
| 2024/0146257 A1 * | 5/2024 | Woo | ..................... | H03F 3/195 |
| 2024/0292519 A1 * | 8/2024 | Arima | ..................... | H03F 3/245 |

FOREIGN PATENT DOCUMENTS

| | | | | |
|---|---|---|---|---|
| WO | 2022/138514 A1 | 6/2022 | | |
| WO | WO-2023112577 A1 * | 6/2023 | ............ | H10W 90/00 |

* cited by examiner

*Primary Examiner* — Matthew D. Anderson
(74) *Attorney, Agent, or Firm* — XSENSUS LLP

(57) ABSTRACT

In a radio frequency module, an outer shield layer includes a first shield portion and a second shield portion. The first shield portion is spaced apart from the main surface of the mounting board in a thickness direction of the mounting board. The second shield portion is connected to the first shield portion and covers at least a part of an outer peripheral surface of the mounting board. The power amplifier has a first main surface and a second main surface. The power amplifier is spaced apart from the main surface of the mounting board in the thickness direction of the mounting board, and the second main surface is in contact with the first shield portion. The plurality of conductor members connect the power amplifier and the mounting board.

20 Claims, 16 Drawing Sheets

RADIO FREQUENCY MODULE AND COMMUNICATION DEVICE

CROSS-REFERENCE TO RELATED APPLICATION

This application claims priority to Japanese Patent Application No. JP 2024-047288 filed on Mar. 22, 2024. The entire contents of the above-identified application, including the specifications, drawings and claims, are incorporated herein by reference in their entirety.

BACKGROUND OF THE DISCLOSURE

1. Field of the Disclosure

The present disclosure generally relates to a radio frequency module and a communication device, and more specifically, relates to a radio frequency module that includes a power amplifier, and a communication device that includes the radio frequency module.

2. Description of the Related Art

International Patent Publication No. 2022/138514 discloses a radio frequency module that includes a mounting board, a power amplifier, a controller, a shield layer, and a bonding wire. The mounting board has a first main surface and a second main surface facing each other. The power amplifier is mounted on the first main surface of the mounting board. The controller is disposed on the power amplifier. In addition, the radio frequency module disclosed in International Patent Publication No. 2022/138514 includes a bonding wire that connects an outer electrode of the controller and the mounting board.

In addition, in the radio frequency module disclosed in International Patent Publication No. 2022/138514, the mounting board has a heat dissipation conductor formed along a thickness direction of the mounting board in a region overlapping the power amplifier in the thickness direction of the mounting board.

SUMMARY OF THE DISCLOSURE

In the radio frequency module disclosed in International Patent Publication No. 2022/138514, there is a case where it is difficult to achieve a reduction in both height and size of the radio frequency module.

A feature of the present disclosure is to provide a radio frequency module and a communication device in which it is possible to achieve a reduction in both height and size.

A radio frequency module according to an aspect of the present disclosure includes a mounting board, an outer shield layer, a power amplifier, and a plurality of conductor members. The mounting board has a main surface. The outer shield layer includes a first shield portion and a second shield portion. The first shield portion is spaced apart from the main surface of the mounting board in a thickness direction of the mounting board. The second shield portion is connected to the first shield portion and covers at least a part of an outer peripheral surface of the mounting board. The power amplifier has a first main surface and a second main surface. The power amplifier is spaced apart from the main surface of the mounting board in the thickness direction of the mounting board, and in which the second main surface is in contact with the first shield portion. The plurality of conductor members connects the power amplifier and the mounting board. The plurality of conductor members each have a length larger than a thickness of the power amplifier and are spaced apart from each other.

A communication device according to an aspect of the present disclosure includes the radio frequency module according to the above aspect, and a signal processing circuit. The signal processing circuit is connected to the radio frequency module.

In the radio frequency module and the communication device according to the above aspect of the present disclosure, it is possible to achieve a reduction in both height and size.

BRIEF DESCRIPTION OF THE DRAWINGS

FIGS. 16A to 16D are step sectional views for describing the method for manufacturing the radio frequency module.

DESCRIPTION OF THE PREFERRED EMBODIMENTS

Figure 1:
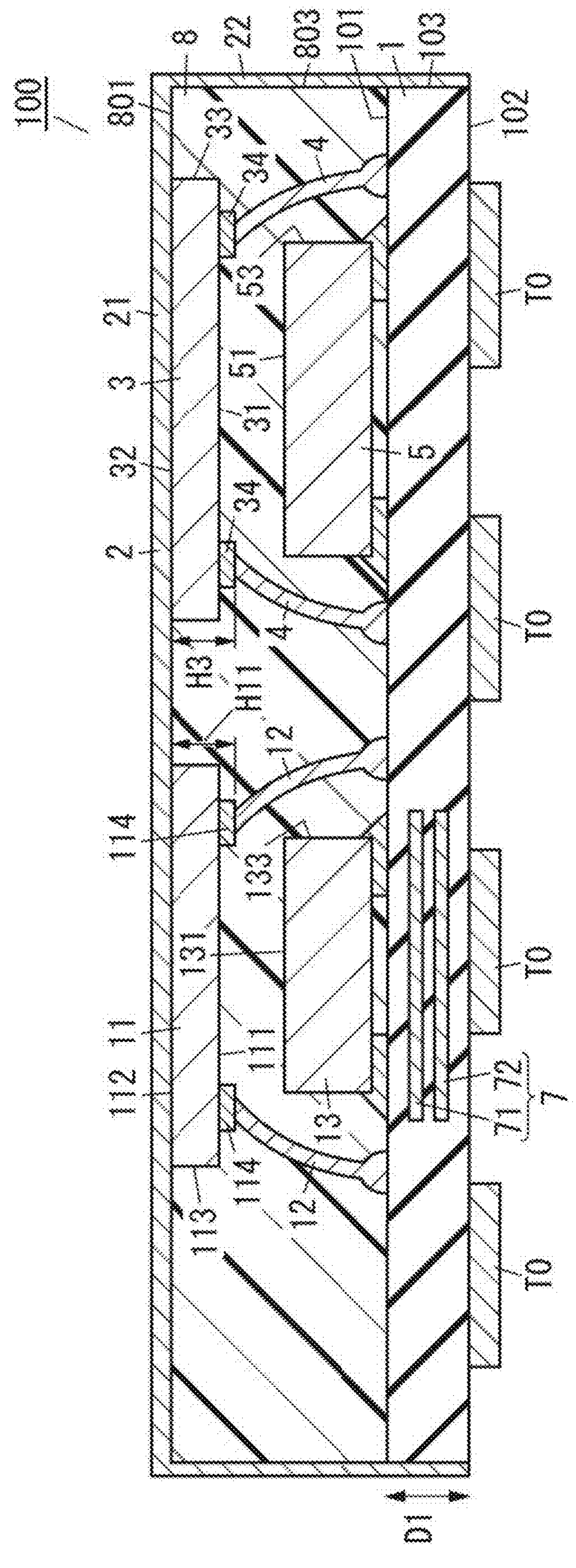
FIG. 1 is a sectional view of a radio frequency module according to Embodiment 1.

Hereinafter, Embodiments 1 to 10 and the like will be described with reference to the drawings. The drawings referred to in Embodiments 1 to 10 below and the like are schematic diagrams, and a size and a thickness of each constituent element in the drawings do not necessarily reflect actual dimensions, and a size ratio and a thickness ratio between the constituent elements do not necessarily reflect actual dimensional ratios.

Embodiment 1

(1) Radio Frequency Module

A radio frequency module 100 according to Embodiment 1 will be described with reference to FIGS. 1 to 4.

As shown in FIG. 1, the radio frequency module 100 according to Embodiment 1 includes a mounting board 1, an outer shield layer 2, a power amplifier 3, and a plurality of conductor members 4 (hereinafter, also referred to as a plurality of first conductor members 4). The mounting board 1 has a main surface 101 (hereinafter, also referred to as a first main surface 101). The outer shield layer 2 includes a first shield portion 21 and a second shield portion 22. The first shield portion 21 is spaced apart from the main surface 101 of the mounting board 1 in a thickness direction D1 of the mounting board 1. The second shield portion 22 is connected to the first shield portion 21 and covers at least a part of an outer peripheral surface 103 of the mounting board 1. The power amplifier 3 is a power amplification IC die. The power amplifier 3 has a first main surface 31 and a second main surface 32. The power amplifier 3 is spaced apart from the main surface 101 of the mounting board 1 in the thickness direction D1 of the mounting board 1, and the second main surface 32 is in contact with the first shield portion 21. The plurality of conductor members 4 connect the power amplifier 3 and the mounting board 1. The plurality of conductor members 4 each have a length larger than the thickness of the power amplifier 3 and are spaced apart from each other.

In addition, as shown in FIG. 1, the radio frequency module 100 further includes an electronic component 5 (hereinafter, also referred to as a first electronic component 5). The first electronic component 5 is disposed on the main surface 101 of the mounting board 1. The first electronic component 5 is located between the mounting board 1 and the power amplifier 3 in the thickness direction D1 of the mounting board 1. The power amplifier 3 is spaced apart from the first electronic component 5 in the thickness direction D1 of the mounting board 1. In the present embodiment, the first electronic component 5 is, for example, a matching element (hereinafter, also referred to as a first matching element) included in an output matching circuit 14 (refer to FIG. 4) for matching the impedance between the power amplifier 3 and a transmission filter 151. The first matching element is, for example, an inductor.

In addition, the radio frequency module 100 further includes a controller 11 and a plurality of second conductor members 12. The controller 11 is an IC die including a control circuit that controls the power amplifier 3. The controller 11 has a third main surface 111 and a fourth main surface 112 facing each other. The controller 11 is spaced apart from the main surface 101 of the mounting board 1 in the thickness direction D1 of the mounting board 1, and the fourth main surface 112 is in contact with the first shield portion 21. The controller 11 is spaced apart from the main surface 101 of the mounting board 1 in the thickness direction D1 of the mounting board 1, and the fourth main surface 112 is in contact with the first shield portion 21. The controller 11 controls the power amplifier 3.

In addition, the radio frequency module 100 further includes a second electronic component 13. The second electronic component 13 is disposed on the main surface 101 of the mounting board 1. The second electronic component 13 is located between the mounting board 1 and the controller 11 in the thickness direction D1 of the mounting board 1. The controller 11 is spaced apart from the second electronic component 13 in the thickness direction D1 of the mounting board 1. In the present embodiment, the second electronic component 13 is, for example, a second matching element included in the output matching circuit 14 (refer to FIG. 4). The second matching element is, for example, a capacitor.

In addition, the radio frequency module 100 further includes a resin layer 8. The resin layer 8 is disposed on the main surface 101 of the mounting board 1.

In addition, the radio frequency module 100 further includes a plurality of external connection terminals TO disposed on a second main surface 102 facing the first main surface 101, which is the main surface 101, in the thickness direction D1 of the mounting board 1.

Figure 4:
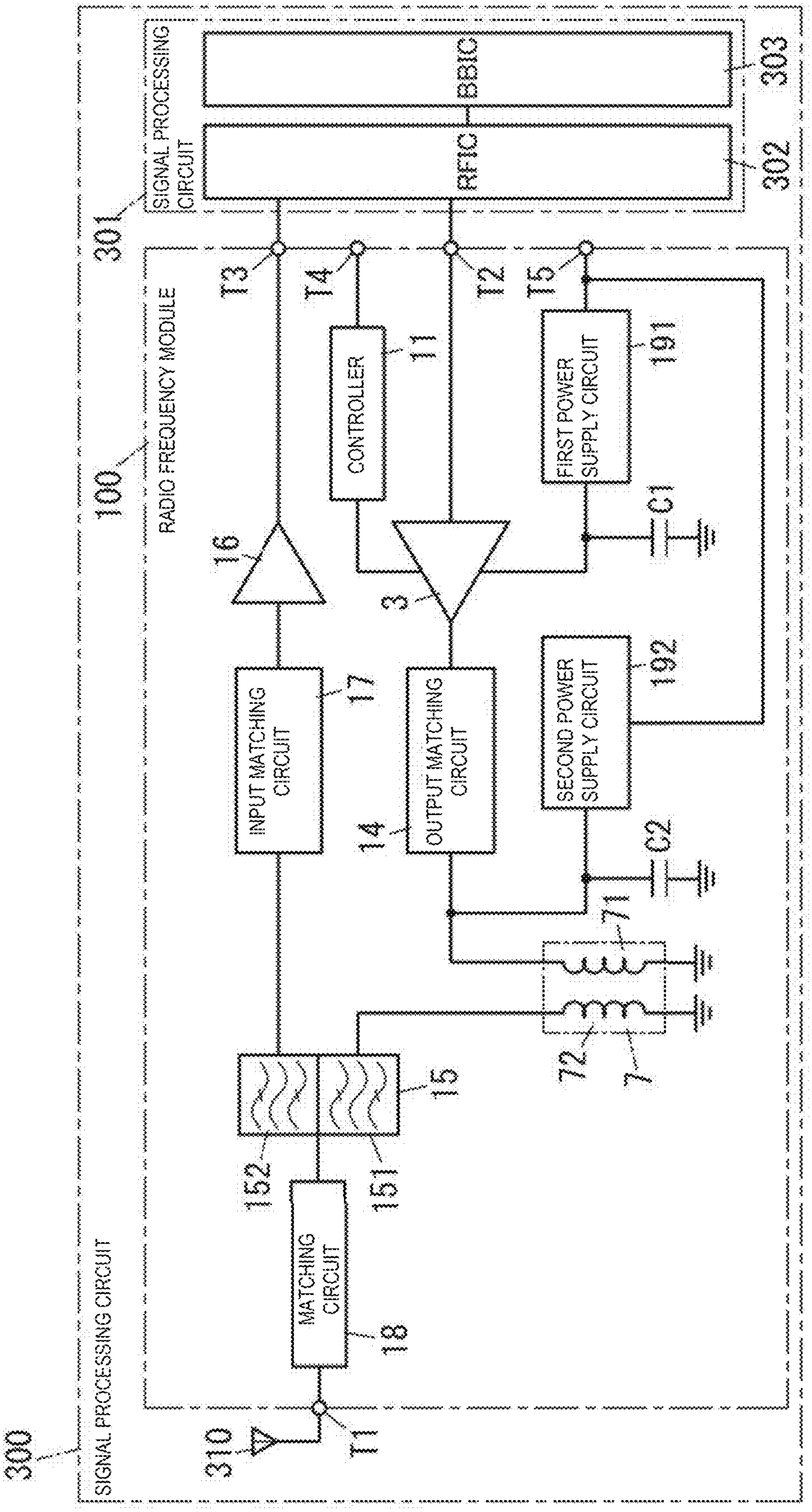
FIG. 4 is a circuit block diagram of a communication device that includes the radio frequency module.

The radio frequency module 100 according to Embodiment 1 is used in, for example, a communication device 300 as shown in FIG. 4. The communication device 300 is, for example, a mobile phone (for example, a smartphone), but is not limited thereto, and may be, for example, a wearable terminal (for example, a smartwatch). The radio frequency module 100 is, for example, a module that is compatible with a fourth generation mobile communication (4G) standard or a fifth generation mobile communication (5G) standard. For example, the 4G standard is the third generation partnership project (3GPP: registered trademark) long term evolution (LTE: registered trademark) standard. The 5G standard is, for example, the 5G new radio (NR). The radio frequency module 100 is, for example, a module capable of supporting carrier aggregation and dual connectivity. For example, as shown in FIG. 4, the radio frequency module 100 has a radio frequency circuit that includes the power amplifier 3, the controller 11, a duplexer 15, the output matching circuit 14, a transformer 7, a low-noise amplifier 16, an input matching circuit 17, a matching circuit 18, a first power supply circuit 191, a first capacitor C1, a second power supply circuit 192, and a second capacitor C2. The duplexer 15 includes the transmission filter 151 and a reception filter 152. The circuit configuration of the radio frequency circuit included in the radio frequency module 100 is not limited to the example of FIG. 4.

(1.1) Mounting Board

As shown in FIG. 1, the mounting board 1 has the first main surface 101 and the second main surface 102 facing each other in the thickness direction D1 of the mounting board 1. In plan view from the thickness direction D1 of the mounting board 1, although an outer edge of the mounting board 1 has, for example, a rectangular shape, the outer edge may have a shape other than a rectangular shape.

The mounting board 1 is, for example, a multilayer board in which a plurality of dielectric layers and a plurality of conductive layers (not shown) are laminated. The plurality of conductive layers are formed in a predetermined pattern determined for each layer. Each of the plurality of conductive layers includes one or a plurality of conductor portions in a plane perpendicular to the thickness direction D1 of the mounting board 1. A material of each conductive layer is, for example, copper. The plurality of conductive layers includes a ground layer. The ground layer of the mounting board 1 is electrically connected to at least one ground terminal included in the plurality of external connection terminals TO with a via conductor or the like, which is included in the mounting board 1, interposed therebetween.

The mounting board 1 is, for example, a low temperature co-fired ceramics (LTCC) board. The mounting board 1 is not limited to the LTCC board, and may be, for example, a printed wiring board, a high temperature co-fired ceramics (HTCC) board, or a resin multilayer board.

(1.2) Electronic Component

The radio frequency module 100 includes a plurality of electronic components. The plurality of electronic components include the first electronic component 5 and second electronic component 13 described above. In the present embodiment, the plurality of electronic components are disposed on the first main surface 101 of the mounting board 1. The expression "the electronic component is disposed on the first main surface 101 of the mounting board 1" includes the electronic component being mounted on (mechanically connected to) the first main surface 101 of the mounting board 1 and the electronic component being electrically connected to (an appropriate conductor portion of) the mounting board 1. The plurality of electronic components are mechanically and electrically connected to the first main surface 101 of the mounting board 1 by a plurality of bonding portions. The plurality of electronic components are circuit components of the radio frequency circuit of the radio frequency module 100. A material of each of the plurality of bonding portions corresponding to each of the plurality of electronic components is, for example, solder. The plurality of bonding portions may be constituent elements of the electronic component or may be constituent elements interposed between the electronic component and the first main surface 101 of the mounting board 1.

In the present embodiment, the plurality of electronic components include, for example, the duplexer 15, a plurality of circuit elements (matching elements) of the output matching circuit 14, the low-noise amplifier 16, a plurality of circuit elements (matching elements) of the input matching circuit 17, a plurality of circuit elements (matching elements) of the matching circuit 18, circuit components of the first power supply circuit 191, the first capacitor C1, circuit components of the second power supply circuit 192, and the second capacitor C2, in addition to the first electronic component 5 and the second electronic component 13.

In plan view from the thickness direction D1 of the mounting board 1, an outer edge of each of the plurality of electronic components has, for example, a rectangular shape. Therefore, in plan view from the thickness direction D1 of the mounting board 1, an outer edge of each of the first electronic component 5 and the second electronic component 13 has a rectangular shape. The first electronic component 5 has a main surface 51 on a side opposite to the mounting board 1 side and an outer peripheral surface 53. The outer peripheral surface 53 of the first electronic component 5 includes four side surfaces of the first electronic component 5 and does not include the main surface 51. The second electronic component 13 has a main surface 131 on a side opposite to the mounting board 1 side and an outer peripheral surface 133. The outer peripheral surface 133 of the second electronic component 13 includes four side surfaces of the second electronic component 13 and does not include the main surface 131.

(1.3) Transformer

In the present embodiment, the transformer 7 is disposed in the mounting board 1. The transformer 7 includes a first coil 71 and a second coil 72. In the present embodiment, the first coil 71 and the second coil 72 are spaced apart from each other in the thickness direction D1 of the mounting board 1 and face each other.

(1.4) Power Amplifier

As described above, the power amplifier 3 is a power amplification IC die. The power amplifier 3 is, for example, a GaAs-based IC die in a case where an amplification transistor included in the power amplifier 3 is a bipolar transistor. Further, the power amplifier 3 is, for example, a Si-based IC die in a case where the amplification transistor is a field effect transistor (FET).

In plan view from the thickness direction D1 of the mounting board 1, an outer edge of the power amplifier 3 has, for example, a rectangular shape.

The power amplifier 3 has the first main surface 31 and the second main surface 32 facing each other in a thickness direction of the power amplifier 3. In addition, the power amplifier 3 has an outer peripheral surface 33. The outer peripheral surface 33 of the power amplifier 3 includes four side surfaces of the power amplifier 3 and does not include the first main surface 31 or the second main surface 32. In addition, the power amplifier 3 has a plurality of terminals 34 (hereinafter, also referred to as first terminals 34) to which the plurality of first conductor members 4 are connected. Each of the plurality of first terminals 34 includes a pad electrode. Each of the plurality of first terminals 34 may further include a solder bump bonded to the pad electrode. In the power amplifier 3, the plurality of first terminals 34 face the first main surface 101 of the mounting board 1. In addition, the first main surface 31 of the power amplifier 3 faces the first main surface 101 of the mounting board 1.

The power amplifier 3 is spaced apart from the first main surface 101 of the mounting board 1 in the thickness direction D1 of the mounting board 1. In the present embodiment, the power amplifier 3 overlaps the first electronic component 5 in plan view from the thickness direction D1 of the mounting board 1. In the present embodiment, in plan view from the thickness direction D1 of the mounting board 1, a part of the power amplifier 3 and the entirety of the first electronic component 5 overlap each other. In the thickness direction D1 of the mounting board 1, the first main surface 31 of the power amplifier 3 is spaced apart from the main surface 51 of the first electronic component 5. The power amplifier 3 is not in contact with the first electronic component 5. In the power amplifier 3, the second main surface 32 of the power amplifier 3 is in contact with the first shield portion 21. In the present embodiment, the entire region of the second main surface 32 of the power amplifier 3 is in contact with the first shield portion 21.

(1.5) First Conductor Member

The plurality of first conductor members 4 connect the power amplifier 3 and the mounting board 1. The plurality of first conductor members 4 each have a length larger than a thickness H3 of the power amplifier 3 and are spaced apart from each other. In plan view from the thickness direction D1 of the mounting board 1, the plurality of first conductor members 4 are spaced apart from each other in a direction along the outer edge of the power amplifier 3. The plurality of first conductor members 4 are not in contact with the first electronic component 5.

Each of the plurality of first conductor members 4 is a linear wire. That is, each of the plurality of first conductor members 4 is a fine metal wire. A material of each of the plurality of first conductor members 4 is, for example, gold, an aluminum alloy, or copper.

The plurality of first conductor members 4 correspond to the plurality of first terminals 34 on a one-to-one basis. Each of the plurality of first conductor members 4 is connected to a corresponding first terminal 34 among the plurality of first terminals 34. In addition, the mounting board 1 has a plurality of first conductor portions (not shown) that correspond to the plurality of first conductor members 4 on a one-to-one basis. Each of the plurality of first conductor members 4 connects a corresponding first terminal 34 among the plurality of first terminals 34 and a corresponding first conductor portion among the plurality of first conductor portions.

(1.6) Controller

The controller 11 is an IC die including a control circuit that controls the power amplifier 3 as described above. For example, a Si-based IC die is used.

In plan view from the thickness direction D1 of the mounting board 1, an outer edge of the controller 11 has, for example, a rectangular shape.

The controller 11 has the third main surface 111 and the fourth main surface 112 facing each other in a thickness direction of the controller 11. In addition, the controller 11 has an outer peripheral surface 113. The outer peripheral surface 113 of the controller 11 includes four side surfaces of the controller 11 and does not include the third main surface 111 or the fourth main surface 112. In addition, the controller 11 has a plurality of second terminals 114 to which the plurality of second conductor members 12 are connected. Each of the plurality of second terminals 114 includes a pad electrode. Each of the plurality of second terminals 114 may further include a solder bump bonded to the pad electrode. In the controller 11, the plurality of second terminals 114 face the first main surface 101 of the mounting board 1. In addition, the third main surface 111 of the controller 11 faces the first main surface 101 of the mounting board 1.

The controller 11 is spaced apart from the first main surface 101 of the mounting board 1 in the thickness direction D1 of the mounting board 1. In the present embodiment, the controller 11 overlaps the second electronic component 13 in plan view from the thickness direction D1 of the mounting board 1. In the present embodiment, in plan view from the thickness direction D1 of the mounting board 1, a part of the controller 11 and the entirety of the second electronic component 13 overlap each other. In the thickness direction D1 of the mounting board 1, the third main surface 111 of the controller 11 is spaced apart from the main surface 131 of the second electronic component 13. The controller 11 is not in contact with the second electronic component 13. In the controller 11, the fourth main surface 112 of the controller 11 is in contact with the first shield portion 21. In the present embodiment, the entire region of the fourth main surface 112 of the controller 11 is in contact with the first shield portion 21.

(1.7) Second Conductor Member

The plurality of second conductor members 12 connect the controller 11 and the mounting board 1. The plurality of second conductor members 12 each have a length larger than a thickness H11 of the controller 11 and are spaced apart from each other. In plan view from the thickness direction D1 of the mounting board 1, the plurality of second conductor members 12 are spaced apart from each other in a direction along the outer edge of the controller 11. The plurality of second conductor members 12 are not in contact with the second electronic component 13.

Each of the plurality of second conductor members 12 is a linear wire. That is, each of the plurality of second conductor members 12 is a fine metal wire. A material of each of the plurality of second conductor members 12 is, for example, gold, an aluminum alloy, or copper.

The plurality of second conductor members 12 correspond to the plurality of second terminals 114 on a one-to-one basis. Each of the plurality of second conductor members 12 is connected to a corresponding second terminal 114 among the plurality of second terminals 114. In addition, the mounting board 1 has a plurality of second conductor portions (not shown) that correspond to the plurality of second conductor members 12 on a one-to-one basis. Each of the plurality of second conductor members 12 connects a corresponding second terminal 114 among the plurality of second terminals 114 and a corresponding second conductor portion among the plurality of second conductor portions.

(1.8) Resin Layer

The resin layer 8 is disposed on the first main surface 101 of the mounting board 1 and covers a plurality of electronic components including the first electronic component 5 and the second electronic component 13. In addition, the resin layer 8 covers the first main surface 31 of the power amplifier 3, the outer peripheral surface 33 of the power amplifier 3, and the plurality of first conductor members 4. In addition, the resin layer 8 covers the fourth main surface 112 of the controller 11, the outer peripheral surface 113 of the controller 11, and the plurality of second conductor members 12. The resin layer 8 does not cover the second main surface 32 of the power amplifier 3. That is, the resin layer 8 exposes the second main surface 32 of the power amplifier 3. In addition, the resin layer 8 does not cover the fourth main surface 112 of the controller 11. That is, the resin layer 8 exposes the fourth main surface 112 of the controller 11.

The resin layer 8 has electric insulation. The resin layer 8 contains resin (for example, epoxy resin). The resin layer 8 may contain a filler in addition to the resin.

(1.9) Outer Shield Layer

The outer shield layer 2 covers the resin layer 8 and the outer peripheral surface 103 of the mounting board 1. More specifically, the outer shield layer 2 covers the second main surface 32 of the power amplifier 3, the fourth main surface 112 of the controller 11, a main surface 801 of the resin layer 8 on a side opposite to the mounting board 1 side, an outer peripheral surface 803 of the resin layer 8, and the outer peripheral surface 103 of the mounting board 1. The outer shield layer 2 includes the first shield portion 21 and the second shield portion 22. The first shield portion 21 is spaced apart from the main surface 101 of the mounting board 1 in the thickness direction D1 of the mounting board 1. The second shield portion 22 is connected to the first shield portion 21 and covers at least a part of the outer peripheral surface 103 of the mounting board 1. In the present embodiment, the first shield portion 21 covers the second main surface 32 of the power amplifier 3, the fourth main surface 112 of the controller 11, and the main surface 801 of the resin layer 8. The second shield portion 22 covers the outer peripheral surface 803 of the resin layer 8 and the outer peripheral surface 103 of the mounting board 1.

The outer shield layer 2 has conductivity. In the radio frequency module 100, the outer shield layer 2 is provided, for example, for the purpose of electromagnetic shielding between the inside and the outside of the radio frequency module 100. The outer shield layer 2 has a multilayer structure in which a plurality of metal layers are laminated, but the present disclosure is not limited thereto, and the outer shield layer 2 may be one metal layer. The metal layer contains one type or a plurality of types of metals. In a case where the shield layer has a multilayer structure in which a plurality of metal layers are laminated, the shield layer includes, for example, a first stainless steel layer, a Cu layer on the first stainless steel layer, and a second stainless steel layer on the Cu layer. A material of each of the first stainless steel layer and the second stainless steel layer is an alloy including Fe, Ni, and Cr. In addition, in a case where the outer shield layer 2 is one metal layer, the outer shield layer 2 is, for example, a Cu layer.

In the outer shield layer 2, the second shield portion 22 is in contact with a ground layer (not shown) of the mounting board 1. The outer shield layer 2 is in contact with the ground layer of the mounting board 1, thereby being directly connected to the ground layer of the mounting board 1. Therefore, the outer shield layer 2 is connected to the ground terminal included in the plurality of external connection terminals TO via, for example, the ground layer of the mounting board 1.

(1.10) External Connection Terminal

The plurality of external connection terminals TO are disposed on the second main surface 102 of the mounting board 1. The expression "the external connection terminal TO is disposed on the second main surface 102 of the mounting board 1" includes the external connection terminal TO being mechanically connected to the mounting board 1 and the external connection terminal TO being electrically connected to (an appropriate conductor portion of) mounting board 1.

In the present embodiment, each of the plurality of external connection terminals TO is a pad electrode (land electrode). A material of each of the plurality of external connection terminals TO includes, for example, copper.

The plurality of external connection terminals TO include a ground terminal. The ground terminal is, for example, a terminal that is electrically connected to a ground electrode of a circuit board provided in the communication device 300 (refer to FIG. 4), and to which a ground potential is applied. In addition, the plurality of external connection terminals TO include an antenna terminal T1 that is connected to an external antenna 310 included in the communication device 300 (refer to FIG. 5), a signal input terminal T2 and a signal output terminal T3 that are connected to a signal processing circuit 301 of the communication device 300, a plurality of control terminals T4 (only one control terminal T4 is shown in FIG. 4), and a power supply terminal T5.

(2) Radio Frequency Circuit

In the radio frequency circuit of the radio frequency module 100, the signal input terminal T2 is connected to an input terminal included in the plurality of first terminals 34 of the power amplifier 3. In addition, in the radio frequency module 100, the signal output terminal T3 is connected to the output terminal of the low-noise amplifier 16. In addition, in the radio frequency module 100, the control terminal T4 is connected to an input terminal included in the plurality of second terminals 114 of the controller 11. In addition, in the radio frequency module 100, the power supply terminal T5 is connected to the first power supply circuit 191 that supplies a first power supply voltage to the power amplifier 3 and the second power supply circuit 192 that supplies a second power supply voltage to the transformer 7. The power supply terminal T5 is connected to, for example, a battery of the communication device 300. In addition, in the radio frequency circuit, the output terminal of the power amplifier 3 is connected to the transmission filter 151 via the output matching circuit 14 and the transformer 7. In addition, in the radio frequency circuit, the reception filter 152 is connected to the input terminal of the low-noise amplifier 16 via the input matching circuit 17. In addition, the transmission filter 151 and the reception filter 152 are connected to the antenna terminal T1 via the matching circuit 18. The output terminal of the first power supply circuit 191 is connected to a power supply terminal included in the plurality of first terminals 34 of the power amplifier 3. The first capacitor C1 is connected between the output terminal of the first power supply circuit 191 and a ground. The output terminal of the second power supply circuit 192 is connected to the transformer 7. The second capacitor C2 is connected between the output terminal of the second power supply circuit 192 and a ground.

The circuit configuration of the radio frequency circuit in the radio frequency module 100 may be a circuit configuration other than the circuit configuration of FIG. 4.

(3) Method for Manufacturing Radio Frequency Module 100

Hereinafter, a method for manufacturing the radio frequency module 100 will be described with reference to FIGS. 2A to 2D and FIGS. 3A to 3D.

In the method for manufacturing the radio frequency module 100, after the preparation of the mounting board 1, a first step to an eighth step are sequentially performed. In the manufacturing method according to the present embodiment, the transformer 7 is formed in the mounting board 1 in advance, and the plurality of external connection terminals TO are disposed on the second main surface 102 of the mounting board 1.

Figure 2A:
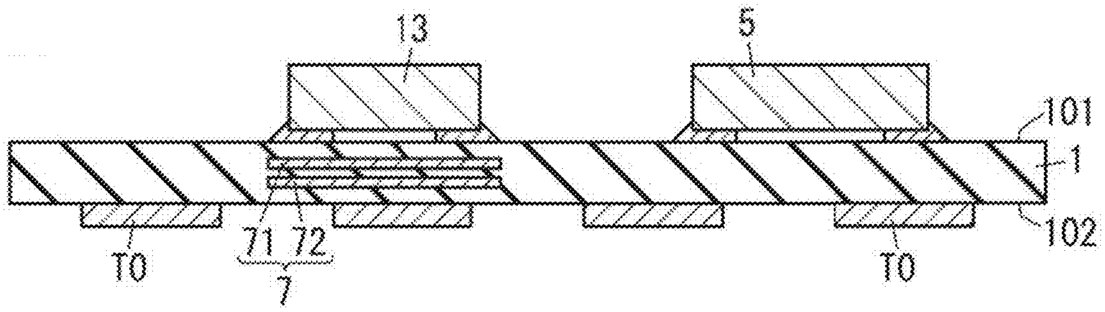
FIGS. 2A to 2D are step sectional views for describing a method for manufacturing the radio frequency module.

In the first step, as shown in FIG. 2A, a plurality of electronic components (the first electronic component 5, the second electronic component 13, and the like) are disposed on the first main surface 101 of the mounting board 1.

Figure 2B:
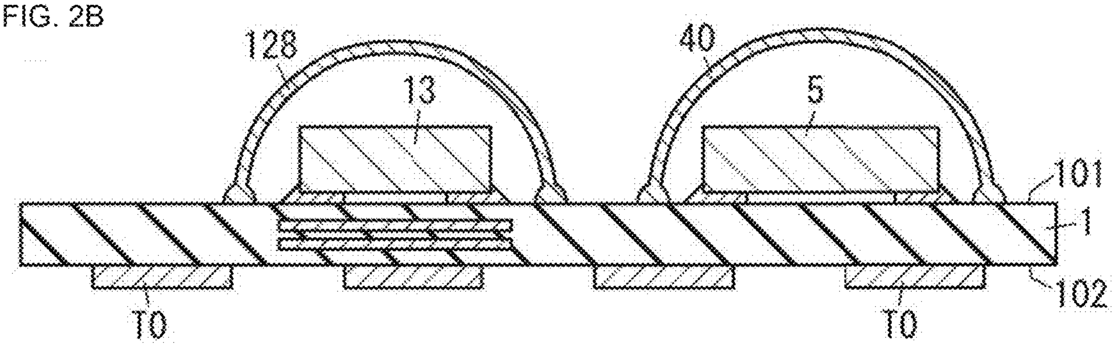

In the second step, as shown in FIG. 2B, arch-shaped bonding wires 40 serving as the base of two first conductor members 4 among the plurality of first conductor members 4 are formed on the first main surface 101 of the mounting board 1 in the number equal to half the number of the first conductor members 4, and arch-shaped bonding wires 128 serving as the base of two second conductor members 12 among the plurality of second conductor members 12 are formed on the first main surface 101 of the mounting board 1 in the number equal to half the number of the second conductor members 12. Each bonding wire 40 formed in the second step has a first end and a second end. The first end and the second end of each bonding wire 40 formed in the second step are bonded to the mounting board 1. In addition, each bonding wire 128 formed in the second step has a first end and a second end. The first end and the second end of each bonding wire 128 formed in the second step are bonded to the mounting board 1.

Figure 2C:
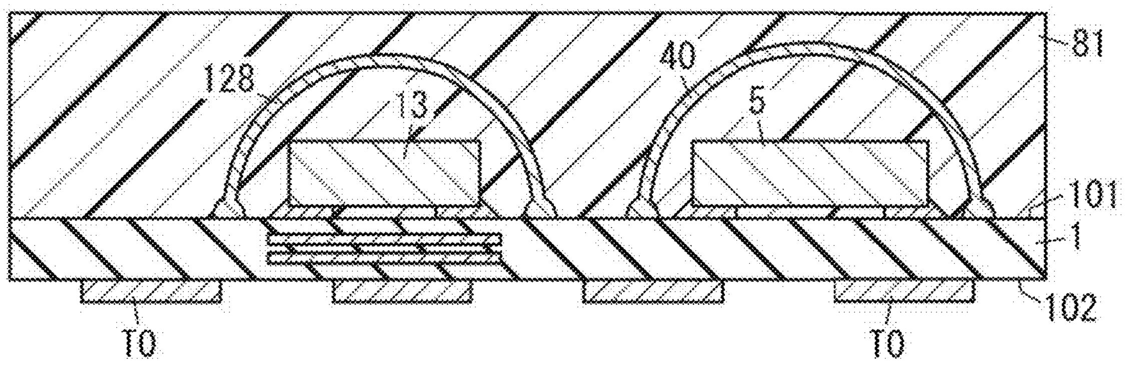

In the third step, as shown in FIG. 2C, a first resin layer 81 serving as the base of a part of the resin layer 8 is formed on the first main surface 101 of the mounting board 1. In the third step, the first resin layer 81 is formed to cover the plurality of electronic components (the first electronic component 5, the second electronic component 13, and the like), each bonding wire 40, and each bonding wire 128.

Figure 2D:
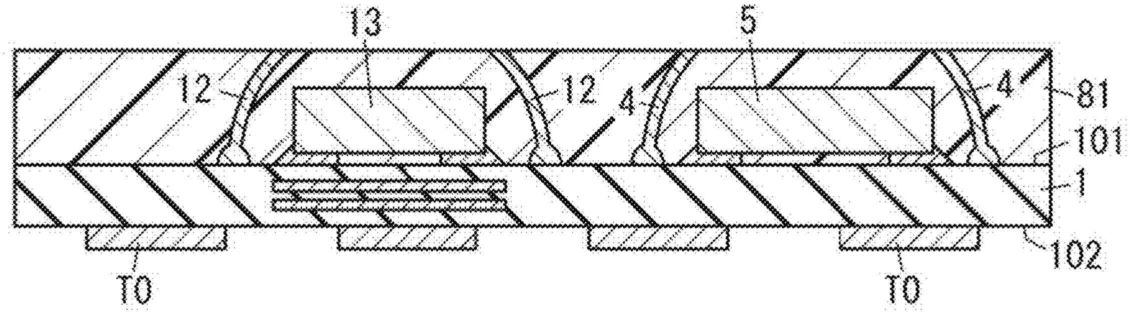

In the fourth step, as shown in FIG. 2D, the first resin layer 81 is polished such that each bonding wire 40 is divided to form two first conductor members 4 and each bonding wire 128 is divided to form two second conductor members 12.

Figure 3A:
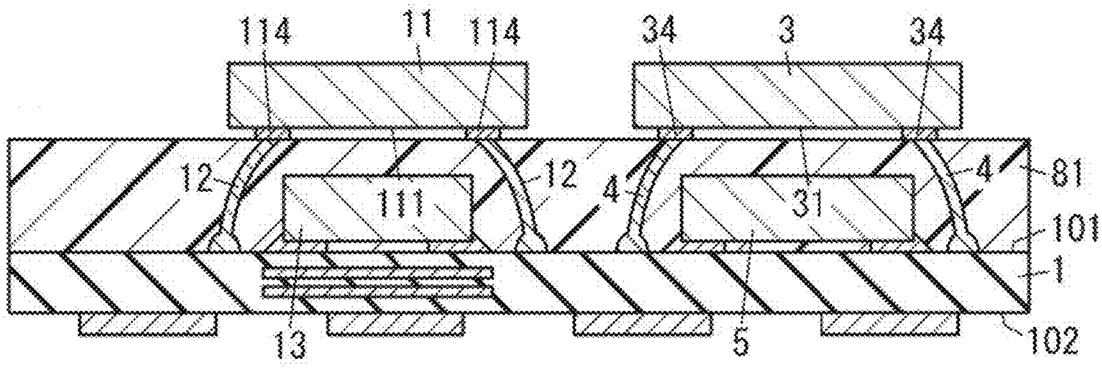
FIGS. 3A to 3D are step sectional views for describing the method for manufacturing the radio frequency module.

In the fifth step, as shown in FIG. 3A, the power amplifier 3 is disposed to be connected to the plurality of first conductor members 4, and the controller 11 is disposed to be connected to the plurality of second conductor members 12. The disposition order of the power amplifier 3 and the controller 11 may be reversed.

Figure 3B:
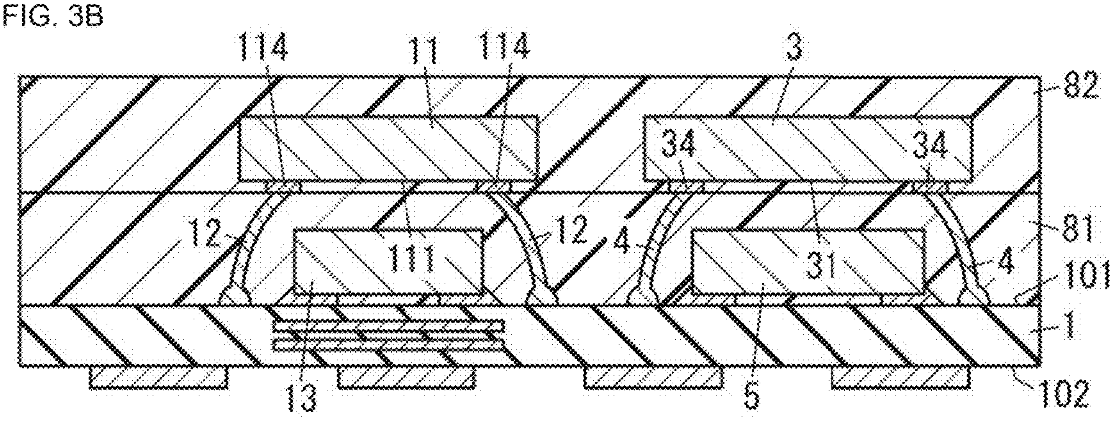

In the sixth step, as shown in FIG. 3B, a second resin layer 82 is formed on the first resin layer 81 to cover the power amplifier 3 and the controller 11.

Figure 3C:
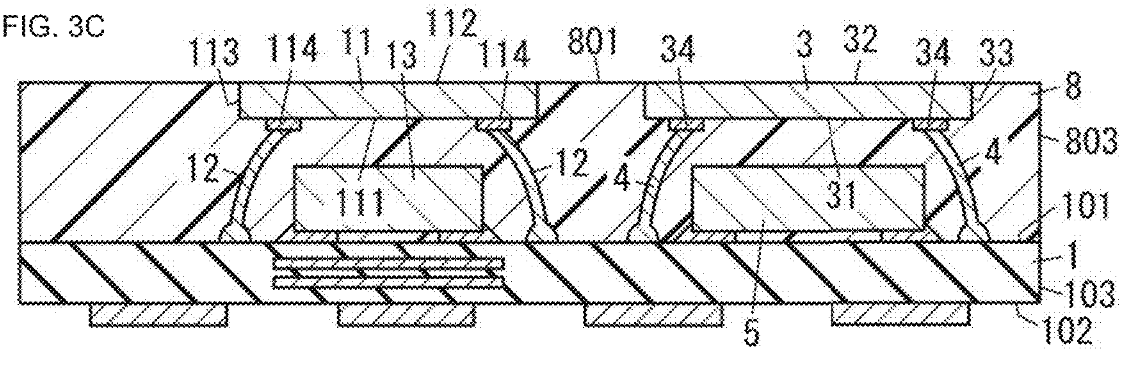

In the seventh step, as shown in FIG. 3C, a part of the second resin layer 82 is polished, and the power amplifier 3 and the controller 11 are polished together with the second resin layer 82 to further reduce the thickness of each of the power amplifier 3 and the controller 11. In FIG. 3C, the first resin layer 81 and the second resin layer 82 are collectively referred to as the resin layer 8.

Figure 3D:
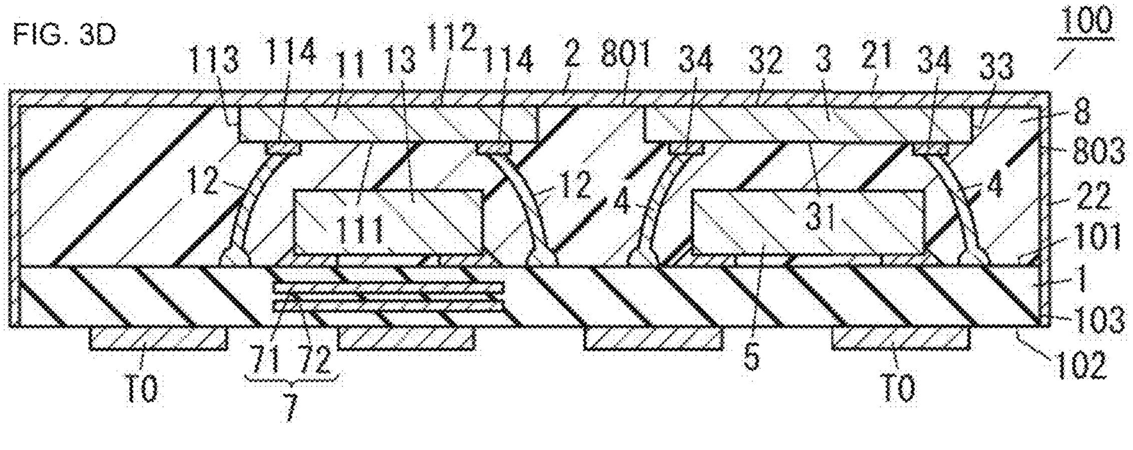

In the eighth step, the outer shield layer 2 is formed as shown in FIG. 3D. In the eighth step, the outer shield layer 2 is formed by, for example, a sputtering method or the like.

In the method for manufacturing the radio frequency module 100, the radio frequency module 100 is manufactured by performing the first step to the eighth step.

(4) Communication Device

The communication device 300 includes, for example, the radio frequency module 100 and the signal processing circuit 301 to which the radio frequency module 100 is connected, as shown in FIG. 4. The communication device 300 further includes the antenna 310. The communication device 300 further includes a circuit board (not shown) on which the radio frequency module 100 is mounted. The circuit board is, for example, a printed wiring board. The circuit board includes a ground electrode to which a ground potential is applied. The radio frequency module 100 is configured, for example, to be able to amplify a reception signal inputted from the antenna 310 and output the amplified reception signal to the signal processing circuit 301. In addition, the radio frequency module 100 is configured, for example, to be able to amplify a transmission signal input from the signal processing circuit 301 and output the amplified transmission signal to the antenna 310. The radio frequency module 100 is controlled by, for example, the signal processing circuit 301 included in the communication device 300.

The signal processing circuit 301 includes an RF signal processing circuit 302 and a baseband signal processing circuit 303. The RF signal processing circuit 302 is, for example, a radio frequency integrated circuit (RFIC) and performs signal processing on a radio frequency signal. The RF signal processing circuit 302, for example, performs signal processing, such as up-conversion, on a radio frequency signal (transmission signal) outputted from the baseband signal processing circuit 303, and outputs the radio frequency signal on which the signal processing is performed. In addition, the RF signal processing circuit 302 performs signal processing, such as down-conversion, on the radio frequency signal (reception signal) outputted from the radio frequency module 100, and outputs the radio frequency signal on which the signal processing is performed to the baseband signal processing circuit 303. The baseband signal processing circuit 303 is, for example, a baseband integrated circuit (BBIC). The baseband signal processing circuit 303 generates an I-phase signal and a Q-phase signal from the baseband signal. The baseband signal is, for example, an audio signal or an image signal inputted from the outside. The baseband signal processing circuit 303 performs IQ modulation processing by combining the I-phase signal and the Q-phase signal, and outputs a transmission signal. At this time, the transmission signal is generated as a modulation signal (IQ signal) in which a carrier wave signal of a predetermined frequency is amplitude-modulated in a period longer than a period of the carrier wave signal. The reception signal processed by the baseband signal processing circuit 303 is used, for example, as an image signal for image display or as an audio signal for a call by the user of the communication device 300.

(5) Effects

The radio frequency module 100 according to Embodiment 1 includes the mounting board 1, the outer shield layer 2, the power amplifier 3, and the plurality of conductor members 4. The mounting board 1 has the main surface 101. The outer shield layer 2 includes the first shield portion 21 and the second shield portion 22. The first shield portion 21 is spaced apart from the main surface 101 of the mounting board 1 in the thickness direction D1 of the mounting board 1. The second shield portion 22 is connected to the first shield portion 21 and covers at least a part of the outer peripheral surface 103 of the mounting board 1. The power amplifier 3 has the first main surface 31 and the second main surface 32. The power amplifier 3 is spaced apart from the main surface 101 of the mounting board 1 in the thickness direction D1 of the mounting board 1, and the second main surface 32 is in contact with the first shield portion 21. The plurality of conductor members 4 connect the power amplifier 3 and the mounting board 1. The plurality of conductor members 4 each have a length larger than the thickness H3 of the power amplifier 3 and are spaced apart from each other.

According to the above-described configuration, it is possible to achieve a reduction in both height and size. More specifically, according to the above-described configuration, since the second main surface 32 of the power amplifier 3 is in contact with the first shield portion 21, the heat generated in the power amplifier 3 is likely to be dissipated through the outer shield layer 2, and a heat dissipation conductor does not need to be disposed in a region overlapping the power amplifier 3 in the thickness direction D1 of the mounting board 1, so that the degree of freedom of the wiring layout in the mounting board 1 is increased and the degree of freedom of the disposition of the electronic component and the circuit element is increased. In addition, according to the above-described configuration, the plurality of conductor members 4 connecting the power amplifier 3 and the mounting board 1 each have a length larger than the thickness H3 of the power amplifier 3 and are spaced apart from each other, and therefore, according to the above-described configuration, it is possible to dispose the electronic component (for example, the first electronic component 5) between the mounting board 1 and the power amplifier 3 in the thickness direction D1 of the mounting board 1, and to dispose the circuit element (for example, the transformer 7) in a region of the mounting board 1 that overlaps the power amplifier 3 in plan view from the thickness direction D1 of the mounting board 1, and thus it is possible to achieve size reduction. In addition, according to the above-described configuration, since the second main surface 32 of the power amplifier 3 is in contact with the first shield portion 21, it is possible to achieve a reduction in height as compared with a case where the power amplifier and the mounting board are connected by a loop-shaped bonding wire and a distance between an apex portion of the loop-shaped bonding wire and the mounting board is longer than a distance between the mounting board and the power amplifier. Therefore, according to the above-described configuration, it is possible to achieve a reduction in height without forming a recess portion in the mounting board, so that the degree of freedom of the wiring layout in the mounting board 1 is increased and the degree of freedom of the disposition of the electronic component and the circuit element is increased. Therefore, according to the above-described configuration, it is possible to achieve a reduction in both height and size.

In addition, the radio frequency module 100 according to Embodiment 1 further includes the electronic component 5 that is disposed on the first main surface 101 of the mounting board 1 and located between the mounting board 1 and the power amplifier 3 in the thickness direction D1 of the mounting board 1. The power amplifier 3 is spaced apart from the electronic component 5 in the thickness direction D1 of the mounting board 1.

According to the above-described configuration, it is possible to achieve size reduction.

In addition, the radio frequency module 100 according to Embodiment 1 further includes the transformer 7 connected to the output terminal included in the plurality of terminals 34 of the power amplifier 3. The electronic component 5 is a matching element connected to the output terminal of the power amplifier 3. The transformer 7 is disposed in the mounting board 1.

According to the above-described configuration, it is possible to achieve size reduction.

In addition, the radio frequency module 100 according to Embodiment 1 further includes the resin layer 8 disposed on the main surface 101 of the mounting board 1. The resin layer 8 covers the electronic component 5, the first main surface 31 of the power amplifier 3, the outer peripheral surface 33 of the power amplifier 3, and the plurality of conductor members 4. The second main surface 32 of the power amplifier 3 is exposed from the resin layer 8 and is in contact with the first shield portion 21.

According to the above-described configuration, since a part of the resin layer 8 is interposed between the power amplifier 3 and the electronic component 5, heat generated in the power amplifier 3 is less likely to be transmitted to the electronic component 5.

In addition, the radio frequency module 100 according to Embodiment 1 further includes the controller 11 that controls the power amplifier 3, and the plurality of second conductor members 12. Unlike the plurality of first conductor members 4, the plurality of second conductor members 12 connect the controller 11 and the mounting board 1. The controller 11 has the third main surface 111 and the fourth main surface 112 facing each other, and the plurality of second terminals 114. The controller 11 is spaced apart from the main surface 101 of the mounting board 1 in the thickness direction D1 of the mounting board 1, and the fourth main surface 112 is in contact with the first shield portion 21.

According to the above-described configuration, it is possible to achieve further size reduction.

Further, the communication device 300 according to Embodiment 1 includes the radio frequency module 100 and the signal processing circuit 301. The signal processing circuit 301 is connected to the radio frequency module 100.

According to the above-described configuration, it is possible to achieve a reduction in both height and size.

Embodiment 2

Figure 5:
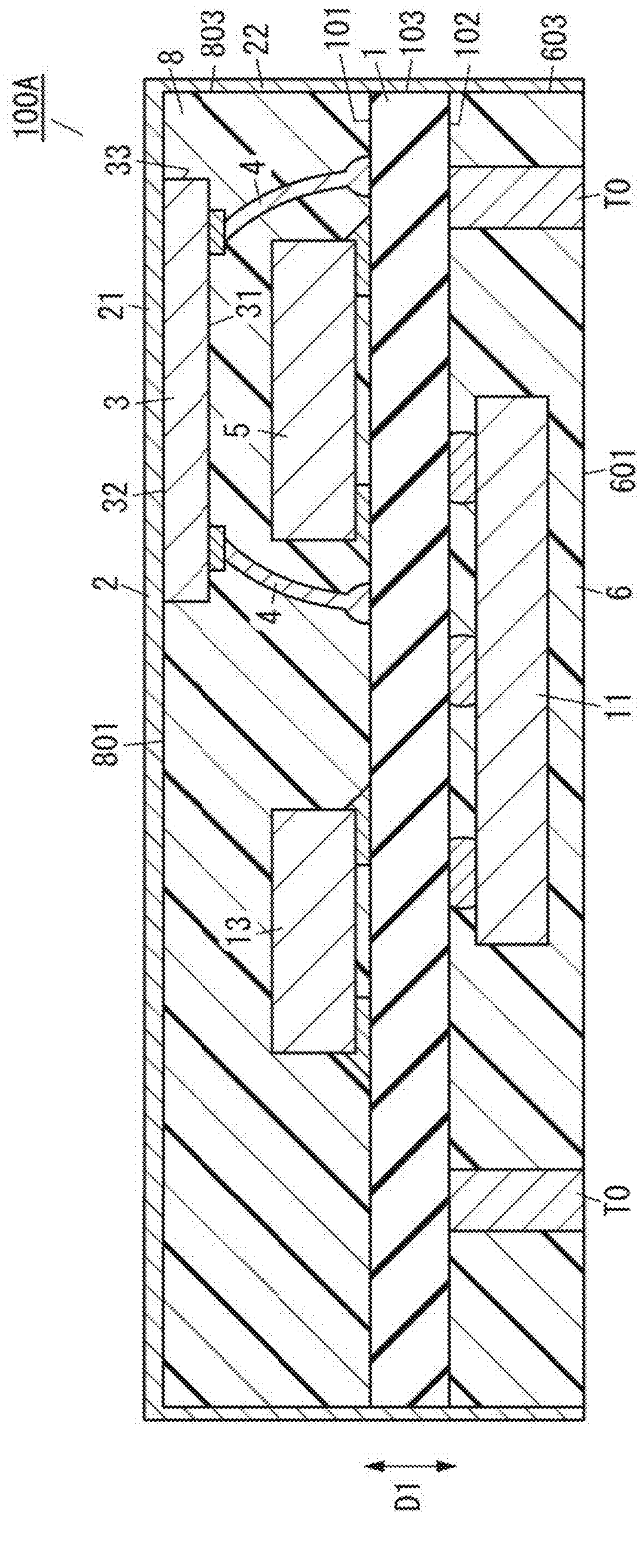
FIG. 5 is a sectional view of a radio frequency module according to Embodiment 2.

A radio frequency module 100A according to Embodiment 2 will be described with reference to FIG. 5. Regarding the radio frequency module 100A according to Embodiment 2, the same constituent elements as those of the radio frequency module 100 (refer to FIGS. 1 to 4) according to Embodiment 1 are denoted by the same reference numerals, and the description thereof will be omitted.

(1) Configuration

The radio frequency module 100A according to Embodiment 2 is different from the radio frequency module 100 according to Embodiment 1 in that some (for example, two) electronic components (hereinafter, also referred to as third electronic components) among the plurality of electronic components are disposed on the second main surface 102 of the mounting board 1. The number of third electronic components disposed on the second main surface 102 of the mounting board 1 is not limited to two, and may be one or three or more.

The two third electronic components disposed on the second main surface 102 of the mounting board 1 include, for example, the controller 11 and the low-noise amplifier (refer to FIG. 4). The expression "the third electronic component is disposed at the second main surface 102 of the mounting board 1" includes the third electronic component being mounted on (mechanically connected to) the second main surface 102 of the mounting board 1 and the third electronic component being electrically connected to (an appropriate conductor portion of) the mounting board 1. The two third electronic components are mechanically and electrically connected to the second main surface 102 of the mounting board 1 by a plurality of bonding portions. The two third electronic components are circuit components of the radio frequency circuit of the radio frequency module 100. A material of each of the plurality of bonding portions corresponding to each of the two third electronic components is, for example, solder. The plurality of bonding portions may be a constituent element of the third electronic component or may be a constituent element that is interposed between the third electronic component and the second main surface 102 of the mounting board 1. In the present embodiment, the transformer 7 (refer to FIGS. 1 and 4) is disposed in the mounting board 1, but may be disposed on the second main surface 102 of the mounting board 1 as the third electronic component.

In plan view from the thickness direction D1 of the mounting board 1, an outer edge of each of the two third electronic components has, for example, a rectangular shape.

In the radio frequency module 100A, the controller 11 is disposed on the second main surface 102 of the mounting board 1. In the radio frequency module 100A, in plan view from the thickness direction D1 of the mounting board 1, the controller 11 overlaps the power amplifier 3. In the present embodiment, a part of the controller 11 overlaps a part of the power amplifier 3, but a part of the controller 11 may overlap the entirety of the power amplifier 3, the entirety of the controller 11 and a part of the power amplifier 3 may overlap each other, or the entirety of the controller 11 and the entirety of the power amplifier 3 may overlap each other.

In addition, in the present embodiment, in plan view from the thickness direction D1 of the mounting board 1, the controller 11 overlaps the electronic component 5. In the present embodiment, a part of the controller 11 overlaps a part of the electronic component 5, but a part of the controller 11 may overlap the entirety of the electronic component 5, the entirety of the controller 11 may overlap a part of the electronic component 5, or the entirety of the controller 11 and the entirety of the electronic component 5 may overlap each other.

In the present embodiment, in plan view from the thickness direction D1 of the mounting board 1, the controller 11 overlaps the electronic component 5 and the power amplifier 3.

The plurality of external connection terminals TO are disposed on the second main surface 102 of the mounting board 1. A material of each of the plurality of external connection terminals TO is, for example, metal (for example, copper, copper alloy, or the like). Each of the plurality of external connection terminals TO is a pillar electrode (for example, a columnar electrode).

In addition, the radio frequency module 100A further includes a resin layer 6 different from the resin layer 8. The resin layer 6 is disposed on the second main surface 102 of the mounting board 1 and covers the two third electronic components. In addition, the resin layer 6 covers a side surface of each of the plurality of external connection terminals TO. The resin layer 6 has electric insulation. The resin layer 6 has electric insulation. The resin layer 6 includes resin (for example, epoxy resin). The resin layer 6 may include a filler in addition to the resin. A material of the resin layer 6 is the same material as the material of the resin layer 8, but may be a different material. The resin layer 6 covers the main surface of the third electronic component on a side opposite to the mounting board 1 side, but may have a form which does not cover the main surface of the third electronic component on a side opposite to the mounting board 1 side.

In addition, in the radio frequency module 100A, the outer shield layer 2 covers the second main surface 32 of the power amplifier 3, the main surface 801 of the resin layer 8, the outer peripheral surface 103 of the mounting board 1, the outer peripheral surface 803 of the resin layer 8, and an outer peripheral surface 603 of the resin layer 6. In the outer shield layer 2, the second shield portion 22 also covers the outer peripheral surface 603 of the resin layer 6. In the radio frequency module 100, a main surface 601 of the resin layer 6 on a side opposite to the mounting board 1 side is not covered with the outer shield layer 2 and is exposed.

(2) Effects

In the radio frequency module 100A according to Embodiment 2, similarly to the radio frequency module 100 according to Embodiment 1, the power amplifier 3 is spaced apart from the main surface 101 of the mounting board 1 in the thickness direction D1 of the mounting board 1, the second main surface 32 of the power amplifier 3 is in contact with the first shield portion 21, and the plurality of conductor members 4 connecting the power amplifier 3 and the mounting board 1 each have a length larger than the thickness H3 (refer to FIG. 1) of the power amplifier 3 and are spaced apart from each other. Therefore, the radio frequency module 100A according to Embodiment 2 can achieve a reduction in both height and size, similarly to the radio frequency module 100 according to Embodiment 1. More specifically, the radio frequency module 100A according to Embodiment 2 is capable of achieving a reduction in both height and size, as compared with a radio frequency module in which a power amplifier is disposed on a first main surface of an mounting board, a controller is stacked on the power amplifier, the controller is connected to the mounting board via a bonding wire, and an electronic component is disposed on a second main surface of the mounting board.

In addition, the radio frequency module 100A according to Embodiment 2 includes the controller 11 disposed on the second main surface 102 of the mounting board 1, and the power amplifier 3 and the controller 11 overlap each other in plan view from the thickness direction D1 of the mounting board 1.

According to the above-described configuration, it is possible to achieve size reduction.

In addition, in the radio frequency module 100A according to Embodiment 2, in plan view from the thickness direction D1 of the mounting board 1, some conductor members 4 among the plurality of conductor members 4 overlap a part of the controller 11.

According to the above-described configuration, it is easy to shorten the wiring length between the power amplifier 3 and the controller 11.

Embodiment 3

Figure 6:
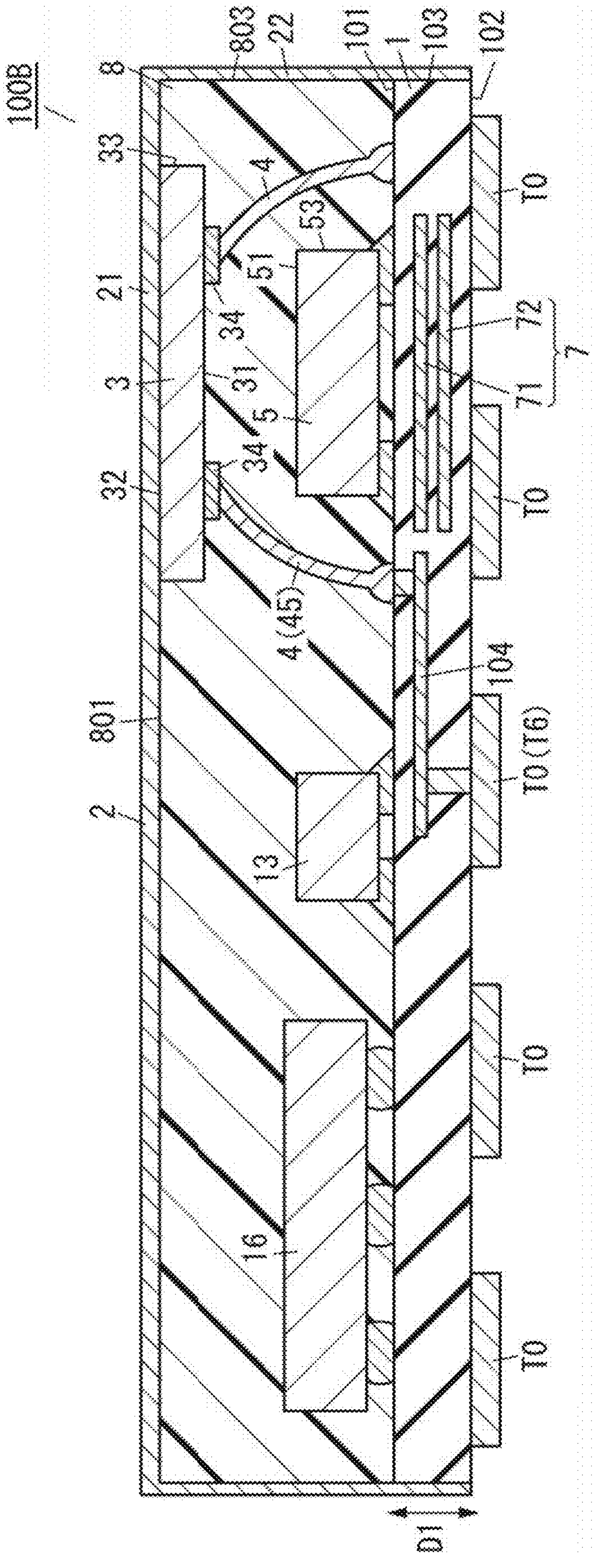
FIG. 6 is a sectional view of a radio frequency module according to Embodiment 3.

A radio frequency module 100B according to Embodiment 3 will be described with reference to FIG. 6. Regarding the radio frequency module 100B according to Embodiment 3, the same constituent elements as those of the radio frequency module 100 (refer to FIGS. 1 to 4) according to Embodiment 1 are denoted by the same reference numerals, and the description thereof will be omitted.

(1) Configuration

The radio frequency module 100B according to Embodiment 3 is different from the radio frequency module 100 according to Embodiment 1 in that the transformer 7 overlaps the power amplifier 3 in plan view from the thickness direction D1 of the mounting board 1.

In addition, in the radio frequency module 100B, the second electronic component 13 adjacent to the first electronic component 5 is an inductor (matching element) included in the input matching circuit 17 (refer to FIG. 4) connected to the input terminal of the low-noise amplifier 16. The second electronic component 13 is adjacent to the first electronic component 5. The expression "the second electronic component 13 is adjacent to the first electronic component 5" means that regarding the plurality of electronic components disposed on the first main surface 101 of the mounting board 1, the second electronic component 13 and the first electronic component 5 are disposed without another electronic component between the second electronic component 13 and the first electronic component 5 in plan view from the thickness direction D1 of the mounting board 1.

The mounting board 1 includes a ground layer 104. The plurality of conductor members 4 include a ground conductor member 45 that is connected to the ground layer 104. The ground layer 104 is connected to at least one ground terminal T6 among two or more ground terminals T6 included in the plurality of external connection terminals TO. In plan view from the thickness direction D1 of the mounting board 1, the ground conductor member 45 is located between the first electronic component 5 and the second electronic component 13.

In addition, in the radio frequency module 100B according to Embodiment 3, in plan view from the thickness direction D1 of the mounting board 1, the transformer 7 overlaps the power amplifier 3. In the present embodiment, the entirety of the transformer 7 overlaps a part of the power amplifier 3, but a part of the transformer 7 may overlap a part of the power amplifier 3.

In addition, in the radio frequency module 100B according to Embodiment 3, the ground layer 104 is adjacent to the transformer 7. The expression "the ground layer 104 is adjacent to the transformer 7" means that the ground layer 104 and the transformer 7 are disposed without another conductor between the ground layer 104 and the transformer 7.

(2) Effects

In the radio frequency module 100B according to Embodiment 3, similarly to the radio frequency module 100 according to Embodiment 1, the power amplifier 3 is spaced apart from the main surface 101 of the mounting board 1 in the thickness direction D1 of the mounting board 1, the second main surface 32 of the power amplifier 3 is in contact with the first shield portion 21, and the plurality of conductor members 4 connecting the power amplifier 3 and the mounting board 1 each have a length larger than the thickness H3 (refer to FIG. 1) of the power amplifier 3 and are spaced apart from each other. Therefore, the radio frequency module 100B according to Embodiment 3 can achieve a reduction in both height and size, similarly to the radio frequency module 100 according to Embodiment 1.

In addition, in the radio frequency module 100B according to Embodiment 3, the second electronic component 13 is disposed on the main surface 101 of the mounting board 1 and is adjacent to the first electronic component 5. The mounting board 1 includes the ground layer 104. The plurality of conductor members 4 include the ground conductor member 45 that is connected to the ground layer 104. In plan view from the thickness direction D1 of the mounting board 1, the ground conductor member 45 is located between the first electronic component 5 and the second electronic component 13.

According to the above-described configuration, it is possible to improve isolation between the first electronic component 5 and the second electronic component 13.

In addition, in the radio frequency module 100B according to Embodiment 3, in plan view from the thickness direction D1 of the mounting board 1, the transformer 7 overlaps the power amplifier 3.

According to the above-described configuration, it is possible to achieve size reduction.

Embodiment 4

Figure 7:
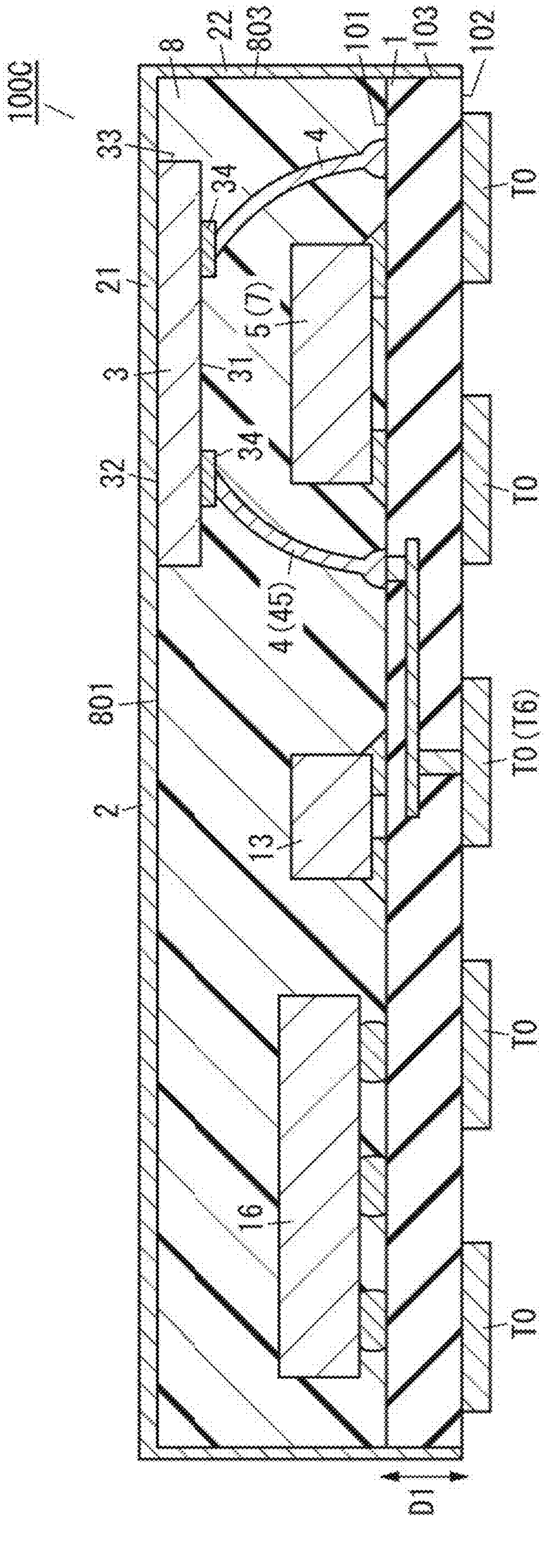
FIG. 7 is a sectional view of a radio frequency module according to Embodiment 4.

A radio frequency module 100C according to Embodiment 4 will be described with reference to FIG. 7. Regarding the radio frequency module 100C according to Embodiment 4, the same constituent elements as those of the radio frequency module 100B (refer to FIG. 6) according to Embodiment 3 are denoted by the same reference numerals, and the description thereof will be omitted.

(1) Configuration

The radio frequency module 100C according to Embodiment 4 is different from the radio frequency module 100B according to Embodiment 3 in that the first electronic component 5 is the transformer 7.

(2) Effects

In the radio frequency module 100C according to Embodiment 4, similarly to the radio frequency module 100 according to Embodiment 1, the power amplifier 3 is spaced apart from the main surface 101 of the mounting board 1 in the thickness direction D1 of the mounting board 1, the second main surface 32 of the power amplifier 3 is in contact with the first shield portion 21, and the plurality of conductor members 4 connecting the power amplifier 3 and the mounting board 1 each have a length larger than the thickness H3 (refer to FIG. 1) of the power amplifier 3 and are spaced apart from each other. Therefore, the radio frequency module 100C according to Embodiment 4 can achieve a reduction in both height and size, similarly to the radio frequency module 100 according to Embodiment 1.

In addition, in the radio frequency module 100C according to Embodiment 4, similarly to the radio frequency module 100B according to Embodiment 3, in plan view from the thickness direction D1 of the mounting board 1, the ground conductor member 45 is located between the first electronic component 5 and the second electronic component 13.

According to the above-described configuration, it is possible to improve isolation between the transformer 7, which is the first electronic component 5, and the second electronic component 13 (matching element of the input matching circuit 17 connected to the input terminal of the low-noise amplifier 16).

Embodiment 5

Figure 8:
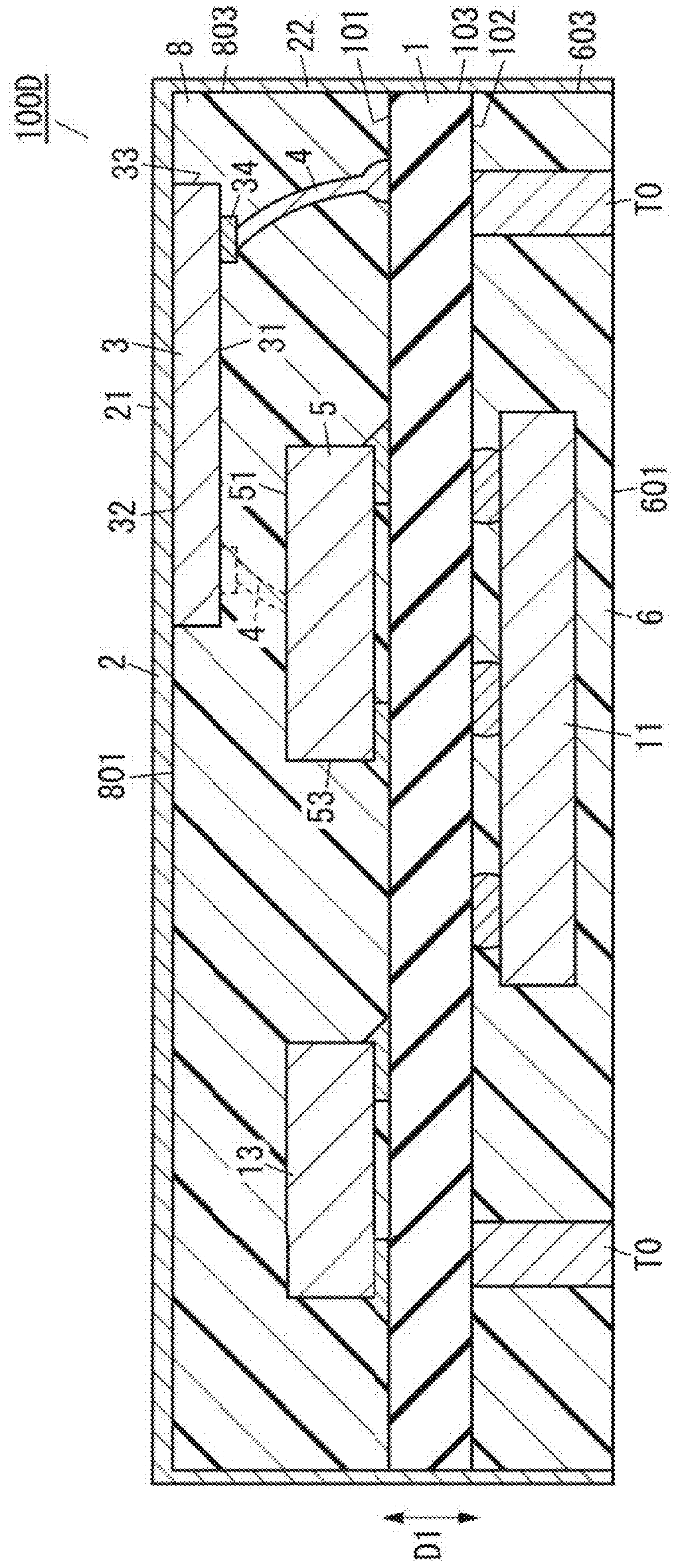
FIG. 8 is a sectional view of a radio frequency module according to Embodiment 5.

A radio frequency module 100D according to Embodiment 5 will be described with reference to FIG. 8. Regarding the radio frequency module 100D according to Embodiment 5, the same constituent elements as those of the radio frequency module 100A (refer to FIG. 5) according to Embodiment 2 are denoted by the same reference numerals, and the description thereof will be omitted.

(1) Configuration

The radio frequency module 100D according to Embodiment 5 is different from the radio frequency module 100A according to Embodiment 2 in that, in plan view from the thickness direction D1 of the mounting board 1, a part of the first electronic component 5, not the entirety of the first electronic component 5, overlaps a part of the power amplifier 3.

(2) Effects

The radio frequency module 100D according to Embodiment 5 can achieve a reduction in both height and size, similarly to the radio frequency module 100A according to Embodiment 2.

Embodiment 6

Figure 9:
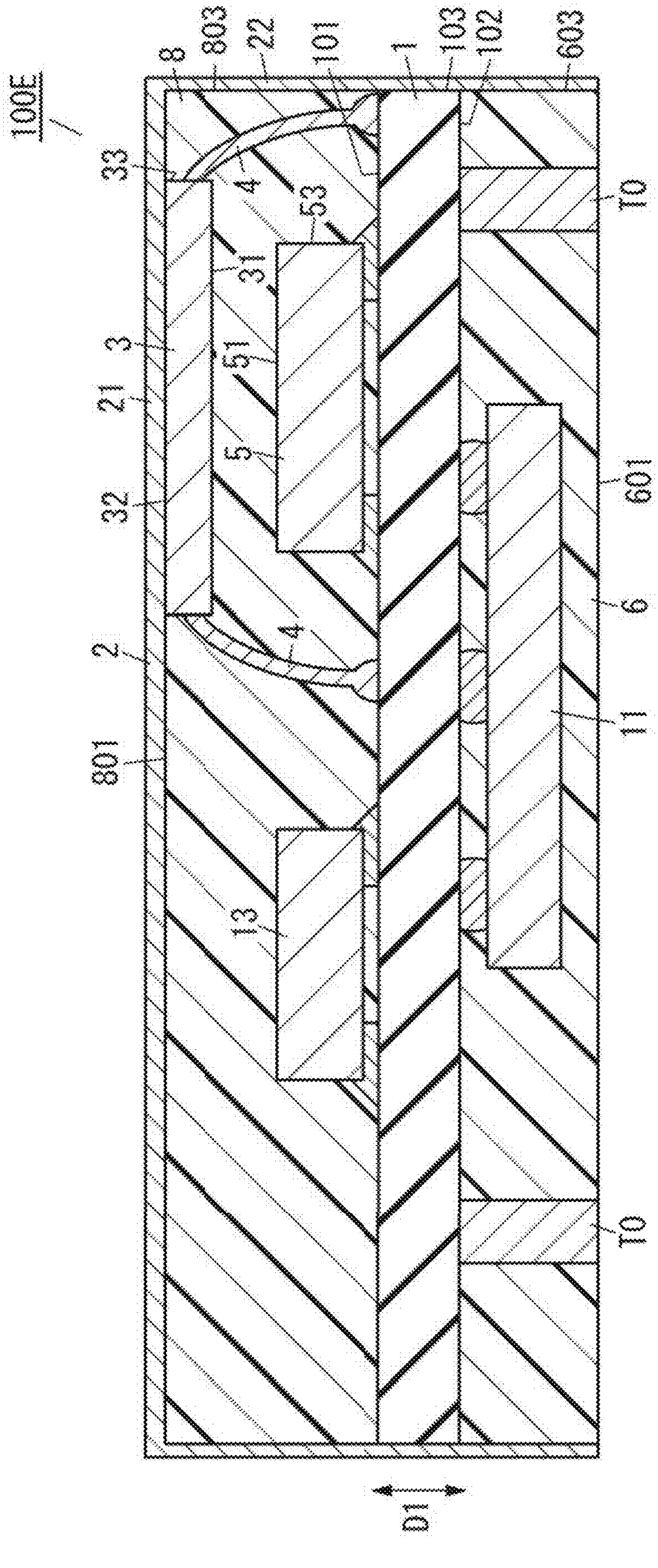
FIG. 9 is a sectional view of a radio frequency module according to Embodiment 6.

A radio frequency module 100E according to Embodiment 6 will be described with reference to FIG. 9. Regarding the radio frequency module 100E according to Embodiment 6, the same constituent elements as those of the radio frequency module 100A (refer to FIG. 5) according to Embodiment 2 are denoted by the same reference numerals, and the description thereof will be omitted.

(1) Configuration

The radio frequency module 100E according to Embodiment 6 is different from the radio frequency module 100A according to Embodiment 2 in that the plurality of conductor members 4 are connected to the power amplifier 3 at the outer peripheral surface 33 of the power amplifier 3.

(2) Effects

The radio frequency module 100E according to Embodiment 6 can achieve a reduction in both height and size, similarly to the radio frequency module 100A according to Embodiment 2.

Embodiment 7

Figure 10:
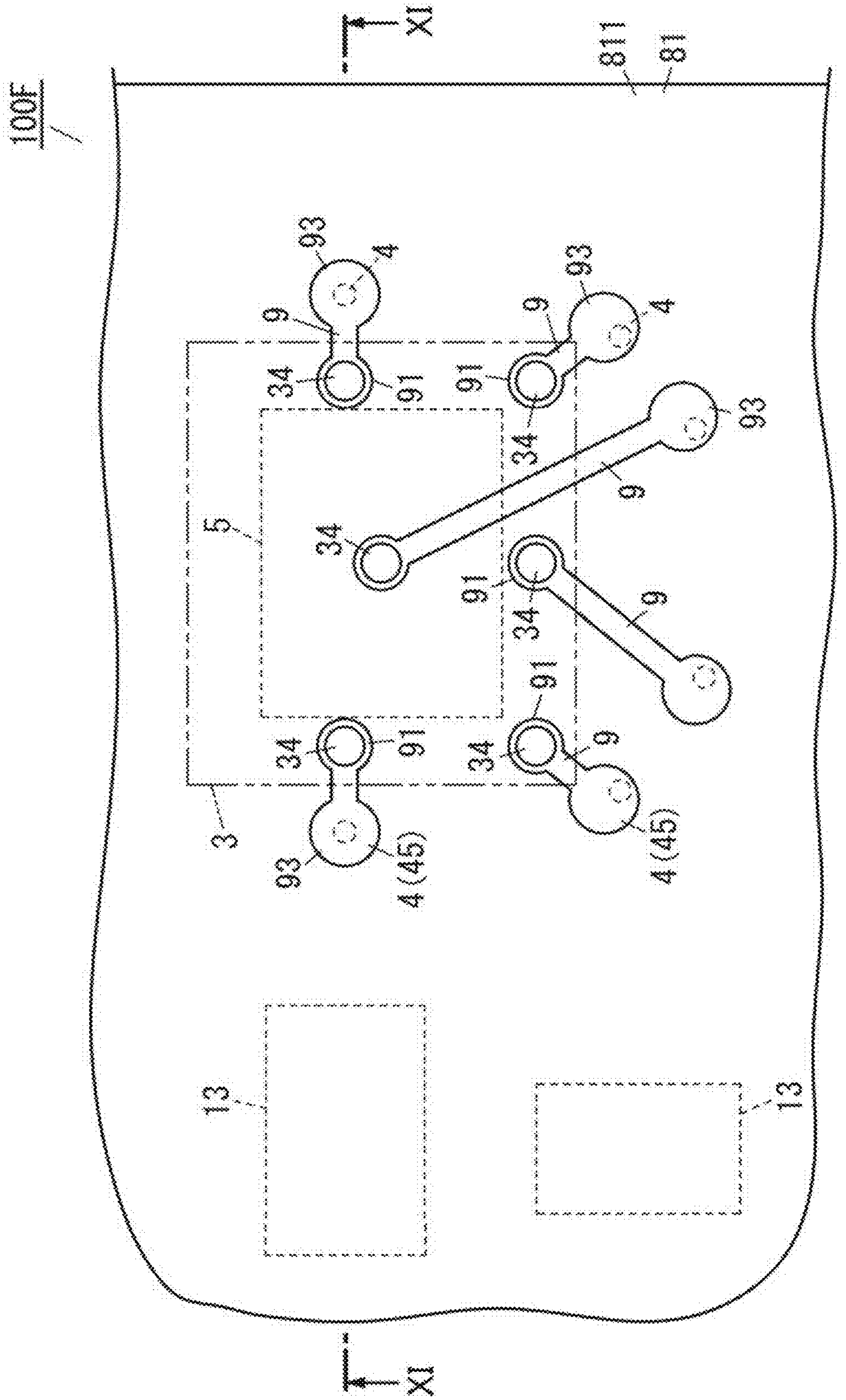
FIG. 10 is a plan view of a main part of a radio frequency module according to Embodiment 7.
Figure 11:
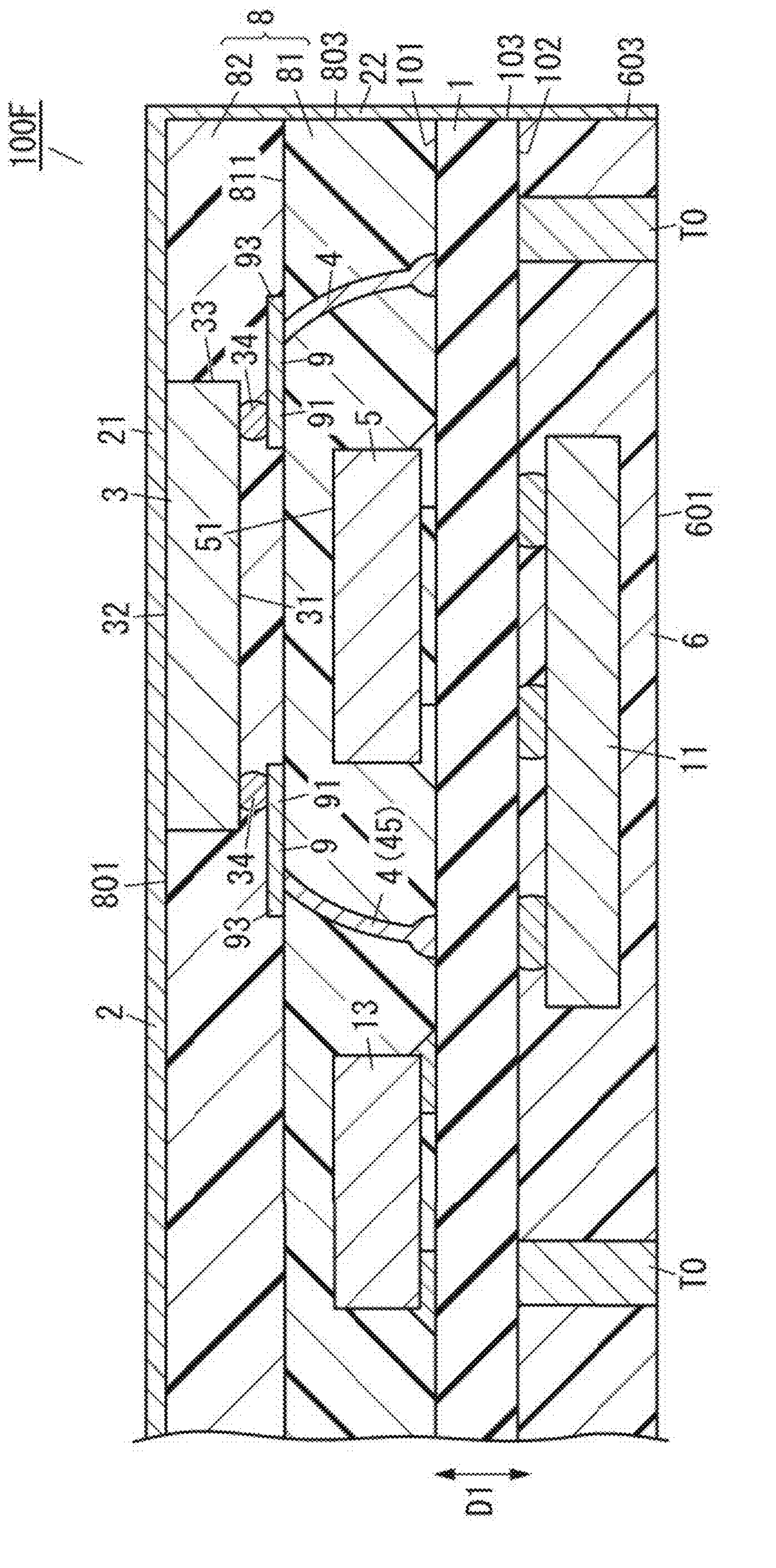
FIG. 11 is a sectional view corresponding to a cross-section taken along line XI-XI of FIG. 10 with respect to the radio frequency module.

A radio frequency module 100F according to Embodiment 7 will be described with reference to FIGS. 10 and 11. Regarding the radio frequency module 100F according to Embodiment 7, the same constituent elements as those of the radio frequency module 100A (refer to FIG. 5) according to Embodiment 2 are denoted by the same reference numerals, and the description thereof will be omitted. FIG. 11 is a sectional view corresponding to a cross-section taken along line XI-XI of FIG. 10. In FIG. 10, the second resin layer 82 and the outer shield layer 2 are not shown.

(1) Configuration

The radio frequency module 100F according to Embodiment 7 is different from the radio frequency module 100A according to Embodiment 2 in that the radio frequency module 100F further includes a plurality of rewiring portions 9. The plurality of rewiring portions 9 correspond to the plurality of conductor members 4 on a one-to-one basis. In addition, the plurality of rewiring portions 9 correspond to the plurality of terminals 34 of the power amplifier 3 on a one-to-one basis. The plurality of rewiring portions 9 connect the plurality of conductor members 4 and the plurality of terminals 34. That is, each of the plurality of rewiring portions 9 connects a corresponding conductor member 4 among the plurality of conductor members 4 and a corresponding terminal 34 among the plurality of terminals 34.

Each of the plurality of rewiring portions 9 has a pad 91 to which a corresponding conductor member 4 among the plurality of conductor members 4 is connected. In plan view from the thickness direction D1 of the mounting board 1, the pad 91 of each of the plurality of conductor members 4 is larger than a connection area with the conductor member 4 that is connected to the pad 91, among the plurality of conductor members 4.

The resin layer 8 includes the first resin layer 81 and the second resin layer 82. The first resin layer 81 is located between the main surface 101 of the mounting board 1 and the power amplifier 3. The first resin layer 81 has a main surface 811 on a side opposite to the mounting board 1 side. The second resin layer 82 is laminated on the first resin layer 81. The plurality of rewiring portions 9 are disposed on the main surface 811 of the first resin layer 81. The second resin layer 82 covers the plurality of rewiring portions 9 and the outer peripheral surface 33 of the power amplifier 3. The second main surface 32 of the power amplifier 3 is exposed from the second resin layer 82 and is in contact with the first shield portion 21.

(2) Effects

The radio frequency module 100F according to Embodiment 7 can achieve a reduction in both height and size, similarly to the radio frequency module 100A according to Embodiment 2.

In addition, since the radio frequency module 100F according to Embodiment 7 further includes the plurality of rewiring portions 9 that connect the plurality of conductor members 4 and the plurality of terminals 34, the degree of freedom of the layout of the plurality of terminals 34 of the power amplifier 3, the degree of freedom of the layout of the power amplifier 3 with respect to the mounting board 1, and the degree of freedom of the layout of the plurality of conductor members 4 are increased.

In addition, in the radio frequency module 100F according to Embodiment 7, each of the plurality of rewiring portions 9 has the pad 91 to which a corresponding conductor member 4 among the plurality of conductor members 4 is connected. In plan view from the thickness direction D1 of the mounting board 1, the pad 91 of each of the plurality of conductor members 4 is larger than a connection area with the conductor member 4 that is connected to the pad 91, among the plurality of conductor members 4.

According to the above-described configuration, the degree of freedom of the layout of the plurality of conductor members 4 is increased.

Embodiment 8

Figure 12:
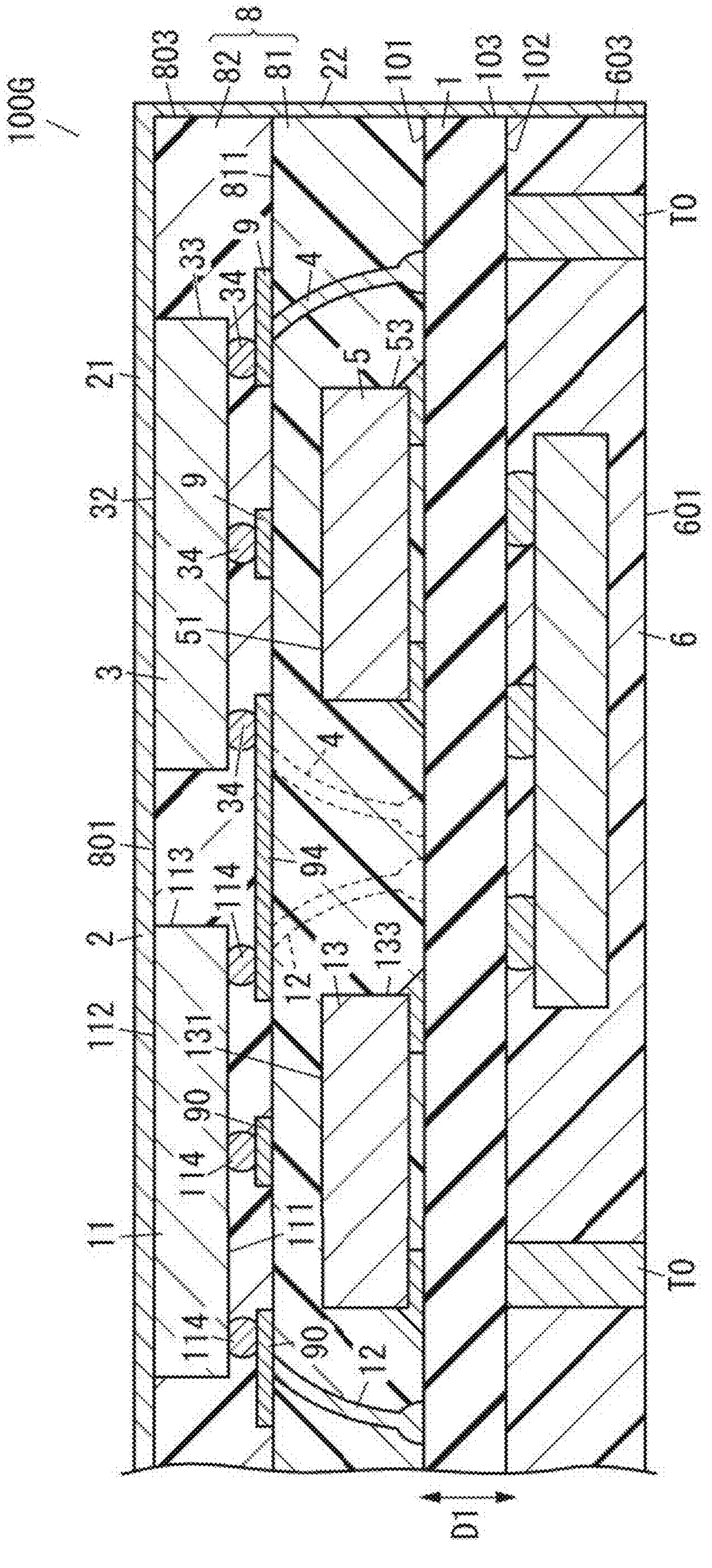
FIG. 12 is a sectional view of a main part of a radio frequency module according to Embodiment 8.

A radio frequency module 100G according to Embodiment 8 will be described with reference to FIG. 12. Regarding the radio frequency module 100G according to Embodiment 8, the same constituent elements as those of the radio frequency module 100F (refer to FIGS. 10 and 11) according to Embodiment 7 are denoted by the same reference numerals, and the description thereof will be omitted.

(1) Configuration

The radio frequency module 100G according to Embodiment 8 is different from the radio frequency module 100F according to Embodiment 7 in that the controller 11 is spaced apart from the main surface 101 of the mounting board 1 in the thickness direction D1 of the mounting board 1 and the fourth main surface 112 of the controller 11 is in contact with the first shield portion 21.

The radio frequency module 100G according to Embodiment 8 is different from the radio frequency module 100F according to Embodiment 7 in that the radio frequency module 100G further includes a plurality of second rewiring portions 90 that is disposed on the main surface 811 of the first resin layer 81 and is different from the first rewiring portions 9 which are the plurality of rewiring portions 9, and a wiring portion 94 that is disposed on the main surface 811 of the first resin layer 81 and connects one first terminal 34 among the plurality of first terminals 34 of the power amplifier 3 and one second terminal 114 among the plurality of second terminals 114 of the controller 11.

The plurality of second rewiring portions 90 correspond to the plurality of second conductor members 12 and the plurality of terminals 114 of the controller 11. In addition, the plurality of second rewiring portions 90 correspond to the plurality of second terminals 114 of the controller 11. The plurality of second rewiring portions 90 connect the plurality of second conductor members 12 and the plurality of second terminals 114. That is, each of the plurality of second rewiring portions 90 connects a corresponding second conductor member 12 among the plurality of second conductor members 12 and a corresponding second terminal 114 among the plurality of second terminals 114.

(2) Effects

The radio frequency module 100G according to Embodiment 8 can achieve a reduction in both height and size, similarly to the radio frequency module 100F according to Embodiment 7.

In addition, the radio frequency module 100G according to Embodiment 8 further includes the controller 11 that controls the power amplifier 3, and the plurality of second conductor members 12, and the controller 11 is spaced apart from the main surface 101 of the mounting board 1 in the thickness direction D1 of the mounting board 1, and the fourth main surface 112 of the controller 11 is in contact with the first shield portion 21, similarly to the radio frequency module 100 according to Embodiment 1.

According to the above-described configuration, it is possible to achieve size reduction.

Embodiment 9

Figure 13:
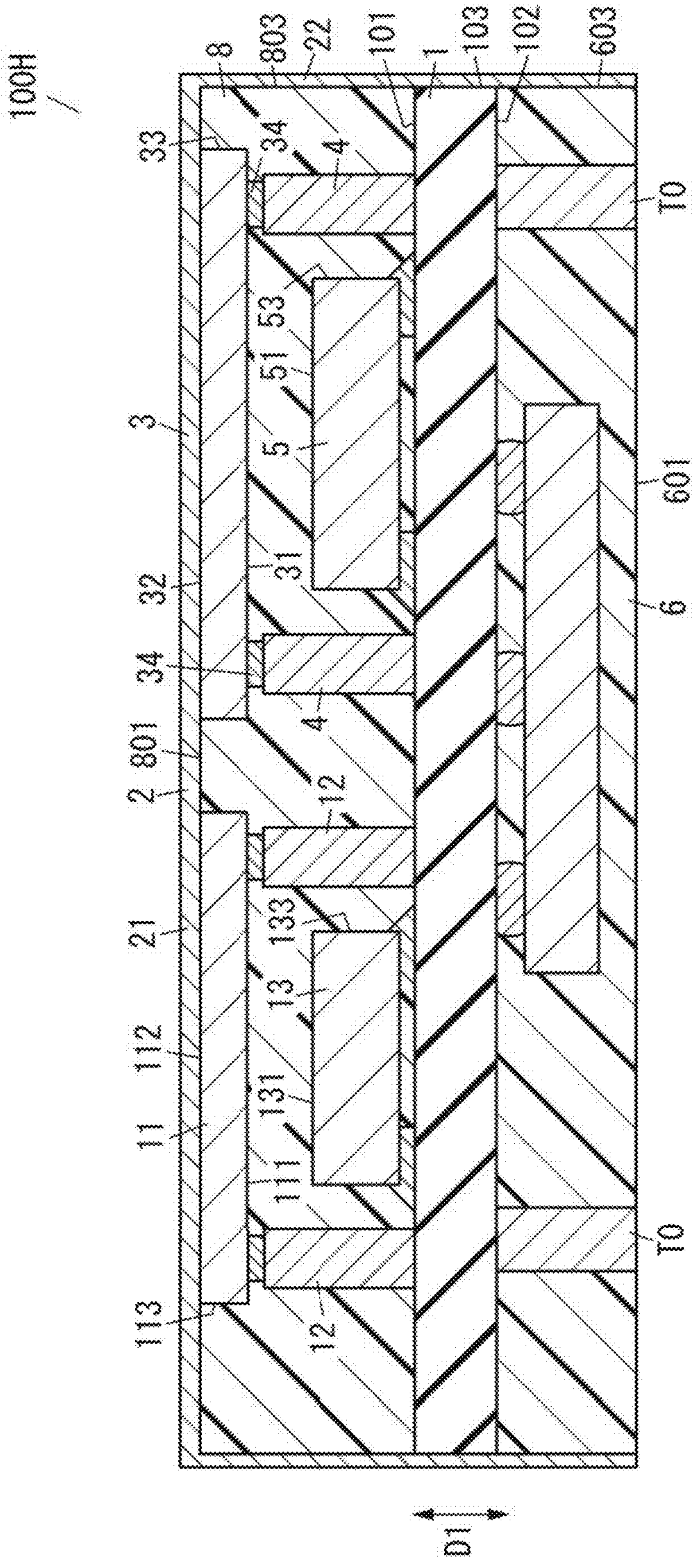
FIG. 13 is a sectional view of a radio frequency module according to Embodiment 9.

A radio frequency module 100H according to Embodiment 9 will be described with reference to FIG. 13. Regarding the radio frequency module 100H according to Embodiment 9, the same constituent elements as those of the radio frequency module 100A (refer to FIG. 5) according to Embodiment 2 are denoted by the same reference numerals, and the description thereof will be omitted.

(1) Configuration

The radio frequency module 100H according to Embodiment 9 is different from the radio frequency module 100A according to Embodiment 2 in that the controller 11 is spaced apart from the main surface 101 of the mounting board 1 in the thickness direction D1 of the mounting board 1 and the fourth main surface 112 of the controller 11 is in contact with the first shield portion 21.

In addition, the radio frequency module 100H is different from the radio frequency module 100A according to Embodiment 2 in that each of the plurality of conductor members 4 has a columnar shape and the power amplifier 3 is supported by the plurality of conductor members 4.

In addition, the radio frequency module 100H according to Embodiment 9 further includes the second conductor member 12 that connects the mounting board 1 and the controller 11, separately from the plurality of first conductor members 4 which are the plurality of conductor members 4. The radio frequency module 100H is different from the radio frequency module 100A according to Embodiment 2 in that each of the plurality of second conductor members 12 has a columnar shape and the controller 11 is supported by the plurality of second conductor members 12.

(2) Effects

The radio frequency module 100H according to Embodiment 9 can achieve a reduction in both height and size, similarly to the radio frequency module 100A according to Embodiment 2.

Embodiment 10

Figure 14:
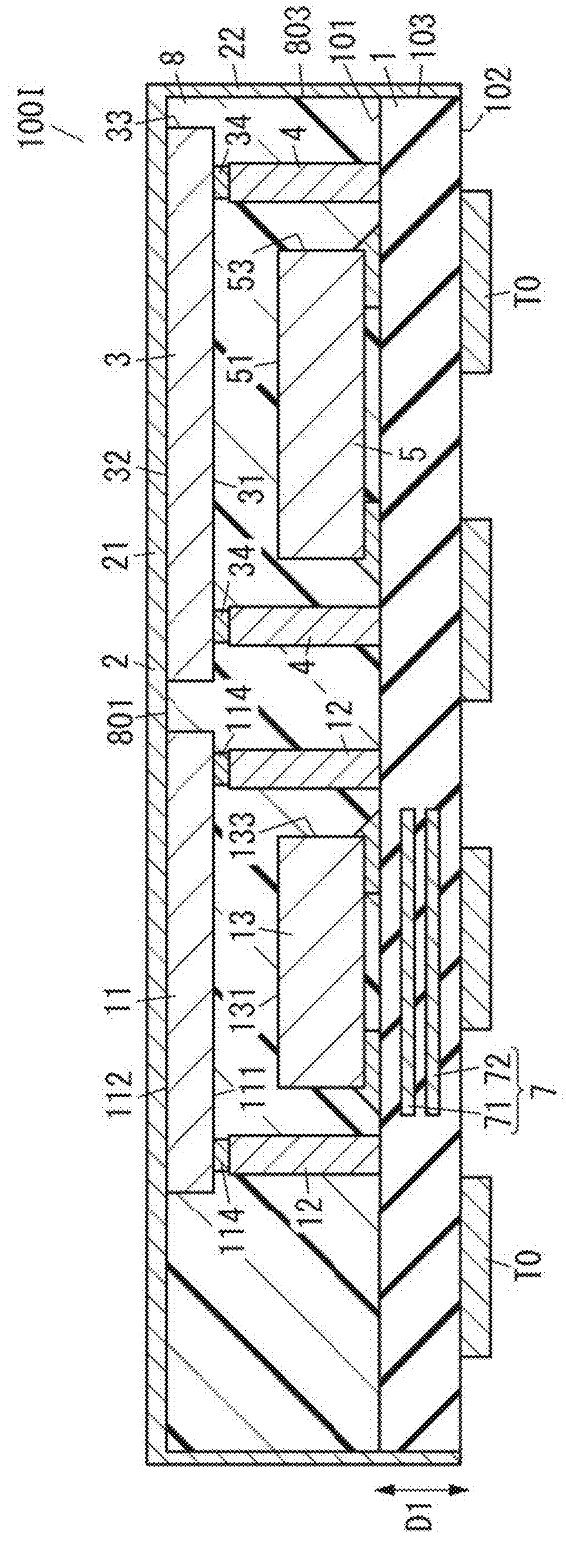
FIG. 14 is a sectional view of a radio frequency module according to Embodiment 10.

A radio frequency module 100I according to Embodiment 10 will be described with reference to FIG. 14. Regarding the radio frequency module 100I according to Embodiment 10, the same constituent elements as those of the radio frequency module 100H (refer to FIG. 13) according to Embodiment 9 are denoted by the same reference numerals, and the description thereof will be omitted.

(1) Configuration

The radio frequency module 100I according to Embodiment 10 is different from the radio frequency module 100 according to Embodiment 1 in that each of the plurality of first conductor members 4 has a pillar shape and the power amplifier 3 is supported by the plurality of first conductor members 4. In addition, the radio frequency module 100I according to Embodiment 10 is different from the radio frequency module 100 according to Embodiment 1 in that each of the plurality of second conductor members 12 has a pillar shape and the controller 11 is supported by the plurality of second conductor members 12.

(2) Method for Manufacturing Radio Frequency Module

Hereinafter, a method for manufacturing the radio frequency module 100I will be described with reference to FIGS. 15A to 15D and FIGS. 16A to 16D.

In the method for manufacturing the radio frequency module 100I, after the preparation of the mounting board 1, a first step to an eighth step are sequentially performed. In the manufacturing method according to the present embodiment, the transformer 7 is formed in the mounting board 1 in advance, and the plurality of external connection terminals TO are disposed on the second main surface 102 of the mounting board 1.

Figure 15A:
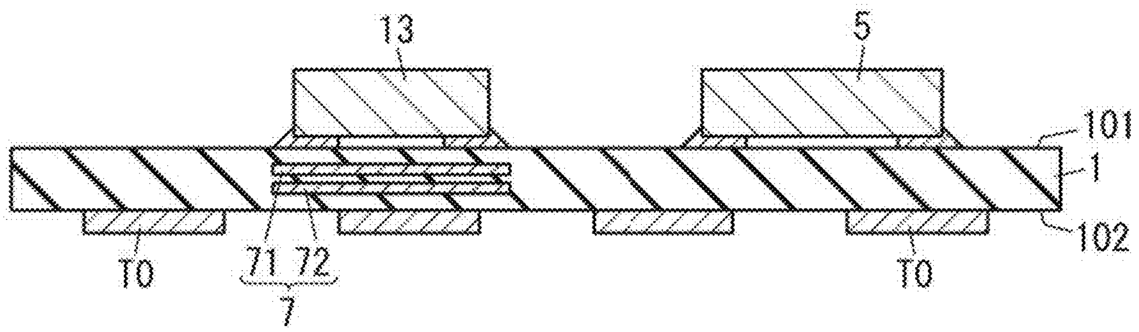
FIGS. 15A to 15D are step sectional views for describing a method for manufacturing the radio frequency module.

In the first step, as shown in FIG. 15A, a plurality of electronic components (the first electronic component 5, the second electronic component 13, and the like) are disposed on the first main surface 101 of the mounting board 1.

Figure 15B:
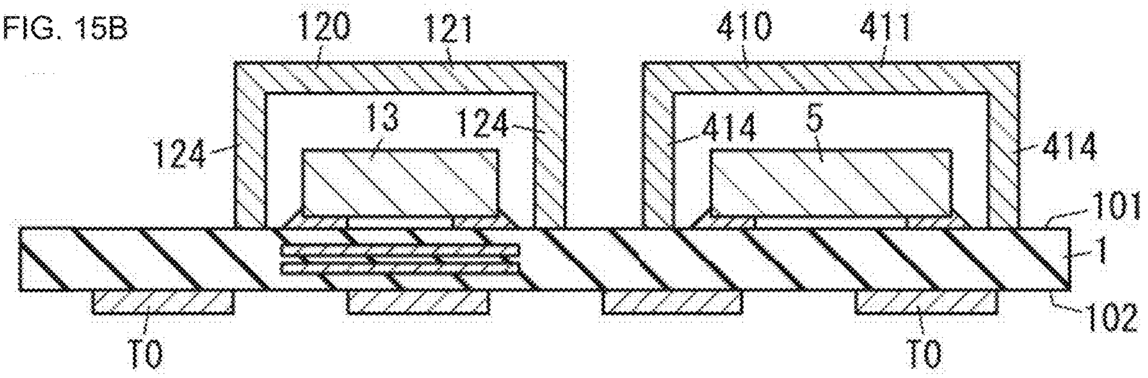

In the second step, as shown in FIG. 15B, a first metal member 410 having a table shape is disposed on the first main surface 101 of the mounting board 1 to surround the first electronic component 5, and a second metal member 120 having a table shape is disposed on the first main surface 101 of the mounting board 1 to surround the second electronic component 13. The first metal member 410 has a plurality of leg portions 414 serving as the base of the plurality of first conductor members 4, and a top plate portion 411 to which the plurality of leg portions 414 are connected. The second metal member 120 has a plurality of leg portions 124 serving as the base of the plurality of second conductor members 12, and a top plate portion 121 to which the plurality of leg portions 124 are connected.

Figure 15C:
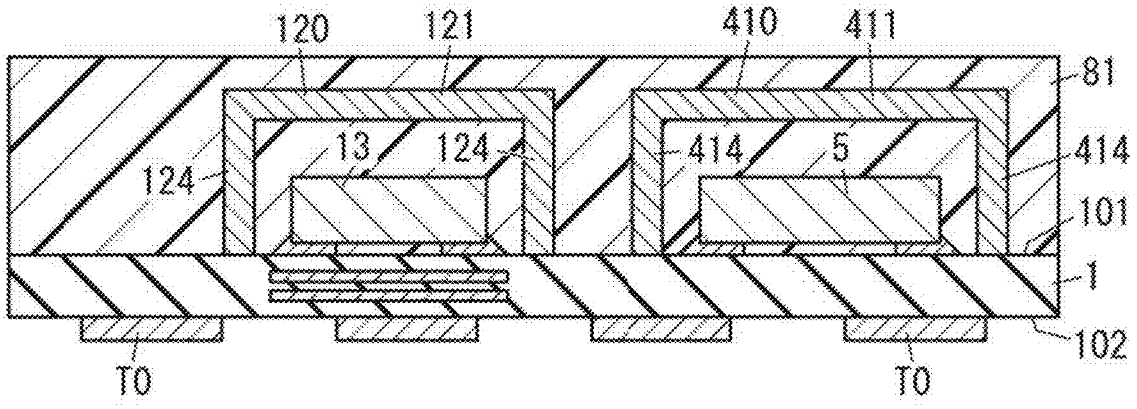

In the third step, as shown in FIG. 15C, the first resin layer 81 serving as the base of a part of the resin layer 8 is formed on the first main surface 101 of the mounting board 1. In the third step, the first resin layer 81 is formed to cover the plurality of electronic components (the first electronic component 5, the second electronic component 13, and the like), the first metal member 410, and the second metal member 120.

Figure 15D:
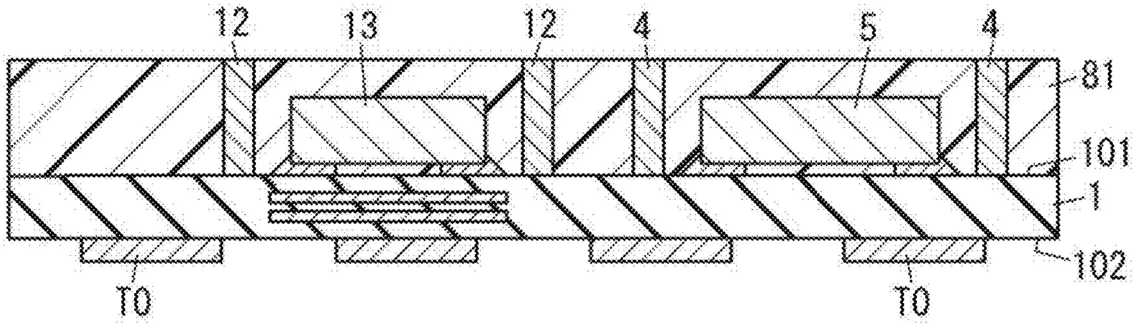

In the fourth step, as shown in FIG. 15D, the first resin layer 81, each top plate portion 411, and each top plate portion 121 are polished such that the plurality of first conductor members 4 are formed by the plurality of leg portions 414 separated by polishing the first metal member 410 and the plurality of second conductor members 12 are formed by the plurality of leg portions 124 separated by polishing the second metal member 120.

Figure 16A:
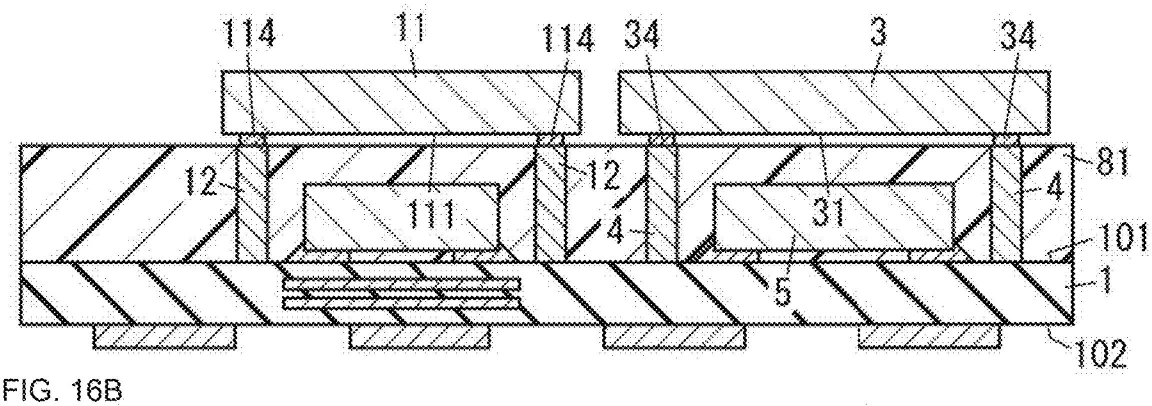

In the fifth step, as shown in FIG. 16A, the power amplifier 3 is disposed to be connected to the plurality of first conductor members 4, and the controller 11 is disposed to be connected to the plurality of second conductor members 12. The disposition order of the power amplifier 3 and the controller 11 may be reversed.

Figure 16B:
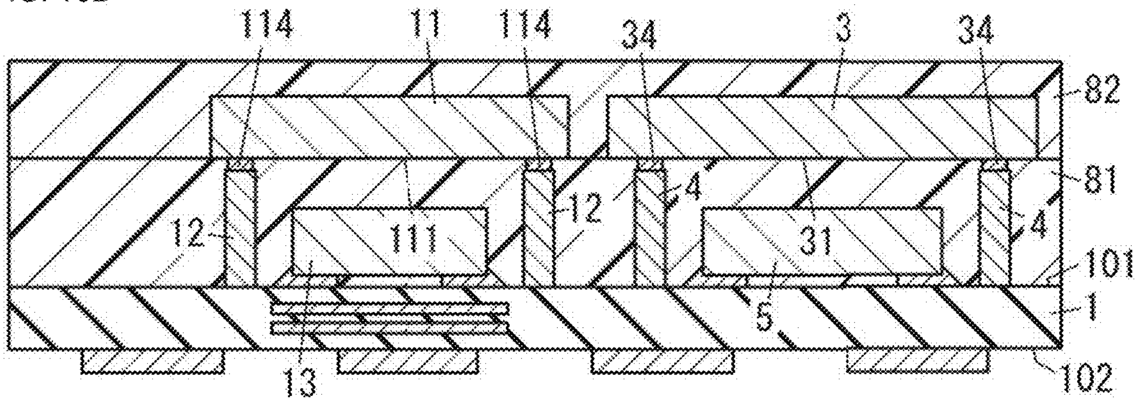

In the sixth step, as shown in FIG. 16B, the second resin layer 82 is formed on the first resin layer 81 to cover the power amplifier 3 and the controller 11.

Figure 16C:
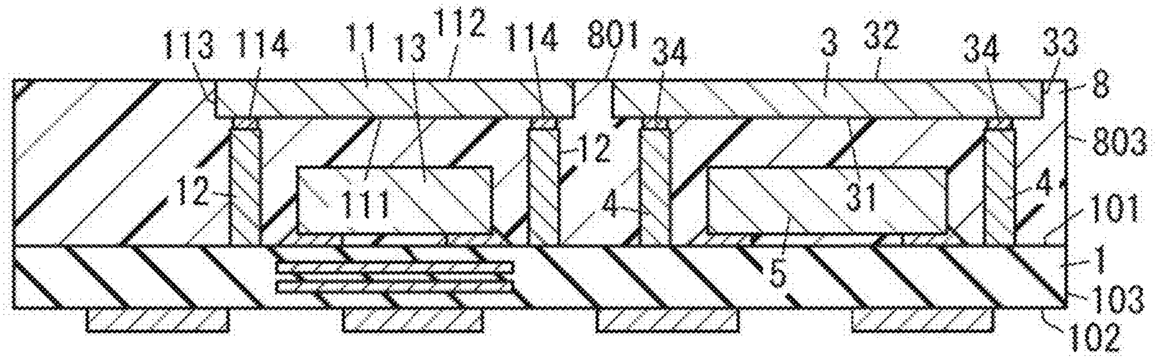
Figure 16C:
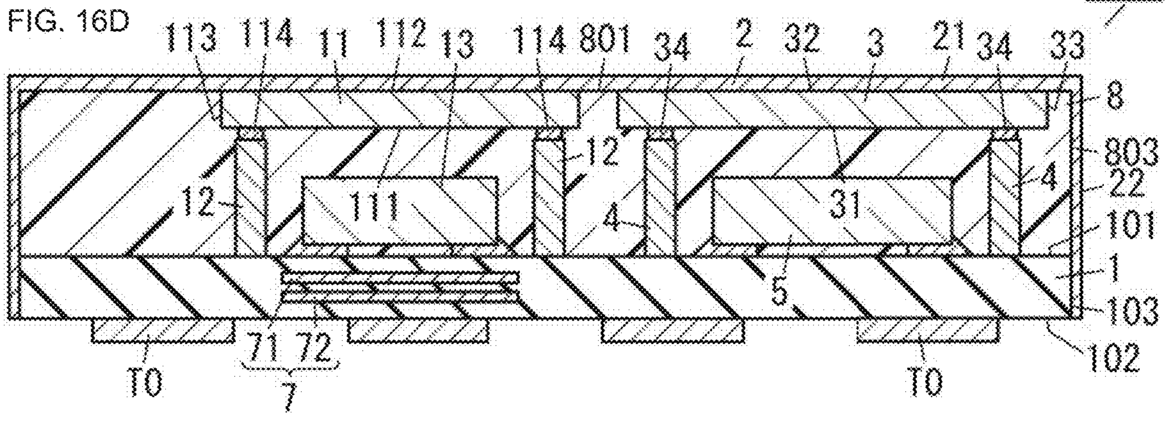

In the seventh step, as shown in FIG. 16C, a part of the second resin layer 82 is polished, and further, the power amplifier 3 and the controller 11 are polished together with the second resin layer 82 to reduce the thickness of each of the power amplifier 3 and the controller 11. In FIG. 16C, the first resin layer 81 and the second resin layer 82 are collectively referred to as the resin layer 8.

In the eighth step, as shown in FIG. 16D, the outer shield layer 2 is formed. In the eighth step, the outer shield layer 2 is formed by, for example, a sputtering method or the like.

In the method for manufacturing the radio frequency module 100I, the radio frequency module 100I is manufactured by performing the first step to the eighth step.

Modification Example

Embodiments 1 to 10 described above and the like are merely one of various embodiments of the present disclosure. In Embodiments 1 to 10 described above and the like, various changes can be made depending on the design or the like as long as the feature of the present disclosure can be achieved, and the embodiments may be appropriately combined.

In addition, in the radio frequency modules 100A, 100D, 100E, 100F, 100G, and 100H, the resin layer 6 disposed on the second main surface 102 of the mounting board 1 covers the main surface of the third electronic component on a side opposite to the mounting board 1 side, but a form in which the main surface of the third electronic component on a side opposite to the mounting board 1 side is not covered may be adopted.

In addition, in the radio frequency modules 100, and 100A to 100H, each of the plurality of external connection terminals TO may be a ball bump.

In addition, the transformer 7 may be disposed on the second main surface 102 of the mounting board 1.

The communication device 300 may include a plurality of antennas including the antenna 310, and the plurality of antennas may be connected to the radio frequency module 100.

In addition, the communication device 300 may include any of the radio frequency modules 100A to 100I instead of the radio frequency module 100.

Aspects

The following aspects are disclosed in the present specification.

A radio frequency module (100; 100A; 100B; 100C; 100D; 100E; 100F; 100H; 100I) according to a first aspect includes a mounting board (1), an outer shield layer (2), a power amplifier (3), and a plurality of conductor members (4). The mounting board (1) has a main surface (101). The outer shield layer (2) includes a first shield portion (21) and a second shield portion (22). The first shield portion (21) is spaced apart from the main surface (101) of the mounting board (1) in a thickness direction (D1) of the mounting board (1). The second shield portion (22) is connected to the first shield portion (21) and covers at least a part of an outer peripheral surface (103) of the mounting board (1). The power amplifier (3) has a first main surface (31) and a second main surface (32). The power amplifier (3) is spaced apart from the main surface (101) of the mounting board (1) in the thickness direction (D1) of the mounting board (1), and the second main surface (32) is in contact with the first shield portion (21). The plurality of conductor members (4) connect the power amplifier (3) and the mounting board (1). The plurality of conductor members (4) each have a length larger than a thickness (H3) of the power amplifier (3) and are spaced apart from each other.

According to this aspect, it is possible to achieve a reduction in both height and size.

In a radio frequency module (100; 100A; 100B; 100C; 100D; 100F; 100G; 100H; 100I) according to a second aspect, in the first aspect, the power amplifier (3) includes a plurality of terminals (34) to which the plurality of conductor members (4) are connected. The plurality of terminals (34) face the main surface (101) of the mounting board (1).

According to this aspect, it is possible to achieve size reduction, as compared with a case where a plurality of terminals (34) are disposed on an outer peripheral surface (33) of the power amplifier (3).

In a radio frequency module (100; 100A; 100B; 100C; 100D) according to a third aspect, in the second aspect, each of the plurality of conductor members (4) is a linear wire. The plurality of conductor members (4) correspond to the plurality of terminals (34) on a one-to-one basis. Each of the plurality of conductor members (4) is connected to a corresponding terminal (34) among the plurality of terminals (34).

In a radio frequency module (100; 100A; 100B; 100C; 100D; 100E; 100F; 100G; 100H; 100I) according to a fourth aspect, in the second or third aspect, the radio frequency module (100; 100A; 100B; 100C; 100D; 100E; 100F; 100G; 100H; 100I) further includes an electronic component (5). The electronic component (5) is disposed on the main surface (101) of the mounting board (1). The electronic component (5) is located between the mounting board (1) and the power amplifier (3) in the thickness direction (D1) of the mounting board (1). The power amplifier (3) is spaced apart from the electronic component (5) in the thickness direction (D1) of the mounting board (1).

According to the aspect, it is possible to achieve size reduction.

In a radio frequency module (100; 100A; 100B; 100C; 100D; 100E; 100F; 100G; 100H; 100I) according to a fifth aspect, in the fourth aspect, the electronic component (5) is a matching element or a transformer (7) connected to an output terminal of the power amplifier (3).

In a radio frequency module (100; 100A; 100B; 100C; 100D; 100E; 100F; 100G; 100H; 100I) according to a sixth aspect, in the fourth aspect, the radio frequency module (100; 100A; 100B; 100C; 100D; 100E; 100F; 100G; 100H; 100I) further includes a transformer (7). The transformer (7) is connected to an output terminal included in the plurality of terminals (34) of the power amplifier (3). The mounting board (1) has a second main surface (102) different from a first main surface (101) which is the main surface (101). The electronic component (5) is a matching element connected to the output terminal of the power amplifier (3). The transformer (7) is disposed in the mounting board (1) or on the second main surface (102) of the mounting board (1).

According to the aspect, it is possible to achieve size reduction.

In a radio frequency module (100B) according to a seventh aspect, in plan view from the thickness direction (D1) of the mounting board (1), the transformer (7) overlaps the power amplifier (3).

According to the aspect, it is possible to achieve size reduction.

In a radio frequency module (100; 100A; 100B; 100C; 100D; 100E; 100F; 100G; 100H; 100I) according to an eighth aspect, in any one of the fourth to seventh aspects, the radio frequency module (100; 100A; 100B; 100C; 100D; 100E; 100F; 100G; 100H; 100I) further includes a resin layer (8). The resin layer (8) is disposed on the main surface (101) of the mounting board (1). The resin layer (8) covers the electronic component (5), the first main surface (31) of the power amplifier (3), the outer peripheral surface (33) of the power amplifier (3), and the plurality of conductor members (4). The second main surface (32) of the power amplifier (3) is exposed from the resin layer (8) and is in contact with the first shield portion (21).

According to this aspect, since a part of the resin layer (8) is interposed between the power amplifier (3) and the electronic component (5), heat generated in the power amplifier (3) is less likely to be transmitted to the electronic component (5).

In a radio frequency module (100F; 100G) according to a ninth aspect, in the eighth aspect, the radio frequency module (100F; 100G) further includes a plurality of rewiring portions (9). The plurality of rewiring portions (9) connect the plurality of conductor members (4) and the plurality of terminals (34). The resin layer (8) includes a first resin layer (81) and a second resin layer (82). The first resin layer (81) is located between the main surface (101) of the mounting board (1) and the power amplifier (3). The first resin layer (81) has a main surface (811). The second resin layer (82) is laminated on the first resin layer (81). The plurality of rewiring portions (9) are disposed on the main surface (811) of the first resin layer (81). The second resin layer (82) covers the plurality of rewiring portions (9) and the outer peripheral surface (33) of the power amplifier (3). The second main surface (32) of the power amplifier (3) is exposed from the second resin layer (82) and is in contact with the first shield portion (21).

According to this aspect, the degree of freedom of the layout of the plurality of terminals (34) of the power amplifier (3), the degree of freedom of the layout of the power amplifier (3) with respect to the mounting board (1), and the degree of freedom of the layout of the plurality of conductor members (4) are increased.

In a radio frequency module (100F; 100G) according to a tenth aspect, in the ninth aspect, each of the plurality of rewiring portions (9) has a pad (91) to which a corresponding conductor member (4) among the plurality of conductor members (4) is connected. In plan view from the thickness direction (D1) of the mounting board (1), the pad (91) of each of the plurality of conductor members (4) is larger than a connection area with the conductor member (4) that is connected to the pad (91), among the plurality of conductor members (4).

According to this aspect, the degree of freedom of the layout of the plurality of conductor members (4) is increased.

In a radio frequency module (100G) according to an eleventh aspect, in the ninth or tenth aspect, the radio frequency module (100G) further includes a controller (11) and a plurality of second conductor members (12). The controller (11) controls the power amplifier (3). Unlike the plurality of first conductor members (4) that are the plurality of conductor members (4), the plurality of second conductor members (12) connect the controller (11) and the mounting board (1). The controller (11) includes a third main surface (111) and a fourth main surface (112) facing each other, and a plurality of second terminals (114) different from a plurality of first terminals (34) which are the plurality of terminals (34). The controller (11) is spaced apart from the main surface (101) of the mounting board (1) in the thickness direction (D1) of the mounting board (1), and the fourth main surface (112) is in contact with the first shield portion (21).

According to the aspect, it is possible to achieve size reduction.

In a radio frequency module (100G) according to a twelfth aspect, in the eleventh aspect, the radio frequency module (100G) further includes a wiring portion (94). The wiring portion (94) is disposed on the main surface (811) of the first resin layer (81). The wiring portion (94) connects the power amplifier (3) and the controller (11).

According to this aspect, it is possible to further shorten the wiring length between the power amplifier (3) and the controller (11).

In a radio frequency module (100C; 100F) according to a thirteenth aspect, in any one of the eighth to twelfth aspects, the radio frequency module (100C; 100F) further includes a second electronic component (13). The second electronic component (13) is disposed on the main surface (101) of the mounting board (1) and is adjacent to a first electronic component (5) which is the electronic component (5). The resin layer (8) covers the second electronic component (13). The mounting board (1) includes a ground layer (104). The plurality of conductor members (4) include a ground conductor member (45) that is connected to the ground layer (104). In plan view from the thickness direction (D1) of the mounting board (1), the ground conductor member (45) is located between the first electronic component (5) and the second electronic component (13).

According to this aspect, it is possible to improve isolation between the first electronic component (5) and the second electronic component (13).

In a radio frequency module (100A; 100D; 100E; 100G; 100H) according to a fourteenth aspect, in any one of the eighth to tenth aspects, the radio frequency module (100A; 100D; 100E; 100G; 100H) further includes a controller (11) that controls the power amplifier (3). The controller (11) is disposed on the second main surface (102) facing a first main surface (101) which is the main surface (101) of the mounting board (1). In plan view from the thickness direction (D1) of the mounting board (1), the power amplifier (3) and the controller (11) overlap each other.

According to the aspect, it is possible to achieve size reduction.

In a radio frequency module (100A; 100D; 100E; 100G; 100H) according to a fifteenth aspect, in the fourteenth aspect, in plan view from the thickness direction (D1) of the mounting board (1), some conductor members (4) among the plurality of conductor members (4) and a part of the controller (11) overlap each other.

According to this aspect, it is easy to shorten the wiring length between the power amplifier (3) and the controller (11).

A communication device (300) according to a sixteenth aspect includes the radio frequency module (100; 100A; 100B; 100C; 100D; 100E; 100F; 100G; 100H; 100I) according to any one of the first to fifteenth aspects, and a signal processing circuit (301). The signal processing circuit (301) is connected to the radio frequency module (100; 100A; 100B; 100C; 100D; 100E; 100F; 100G; 100H; 100I).

According to this aspect, it is possible to achieve a reduction in both height and size.

What is claimed is:

1. A radio frequency module comprising:

a mounting board that has a main surface;

an outer shield layer that includes a first shield portion which is spaced apart from the main surface of the mounting board in a thickness direction of the mounting board, and a second shield portion which is connected to the first shield portion and covers at least a part of an outer peripheral surface of the mounting board;

a power amplifier that has a first main surface and a second main surface, and which is spaced apart from the main surface of the mounting board in the thickness direction of the mounting board, and in which the second main surface is in contact with the first shield portion; and a plurality of conductor members that connect the power amplifier and the mounting board, and each of which has a length larger than a thickness of the power amplifier, and that are spaced apart from each other.

2. The radio frequency module according to claim 1, wherein the power amplifier has a plurality of terminals to which the plurality of conductor members are connected, and the plurality of terminals face the main surface of the mounting board.

3. The radio frequency module according to claim 2, further comprising:

an electronic component that is disposed on the main surface of the mounting board and is located between the mounting board and the power amplifier in the thickness direction of the mounting board, wherein the power amplifier is spaced apart from the electronic component in the thickness direction of the mounting board.

4. The radio frequency module according to claim 3, wherein the electronic component is a matching element or a transformer connected to an output terminal of the power amplifier.

5. The radio frequency module according to claim 2, wherein each of the plurality of conductor members is a linear wire, the plurality of conductor members correspond to the plurality of terminals on a one-to-one basis, and each of the plurality of conductor members is connected to a corresponding terminal among the plurality of terminals.

6. The radio frequency module according to claim 5, further comprising:

an electronic component that is disposed on the main surface of the mounting board and is located between the mounting board and the power amplifier in the thickness direction of the mounting board, wherein the power amplifier is spaced apart from the electronic component in the thickness direction of the mounting board.

7. The radio frequency module according to claim 6, wherein the electronic component is a matching element or a transformer connected to an output terminal of the power amplifier.

8. The radio frequency module according to claim 6, further comprising:

a transformer that is connected to an output terminal included in the plurality of terminals of the power amplifier, wherein the mounting board has a second main surface different from a first main surface which is the main surface, the electronic component is a matching element connected to the output terminal of the power amplifier, and the transformer is disposed in the mounting board or on the second main surface of the mounting board.

9. The radio frequency module according to claim 8, wherein in plan view from the thickness direction of the mounting board, the transformer overlaps the power amplifier.

10. The radio frequency module according to claim 6, further comprising:

a resin layer that is disposed on the main surface of the mounting board, wherein the resin layer covers the electronic component, the first main surface of the power amplifier, an outer peripheral surface of the power amplifier, and the plurality of conductor members, and the second main surface of the power amplifier is exposed from the resin layer and is in contact with the first shield portion.

11. The radio frequency module according to claim 10, further comprising:

a plurality of rewiring portions that connect the plurality of conductor members and the plurality of terminals, wherein the resin layer includes a first resin layer that is located between the main surface of the mounting board and the power amplifier and that has a main surface, and a second resin layer that is laminated on the first resin layer, the plurality of rewiring portions are disposed on the main surface of the first resin layer, the second resin layer covers the plurality of rewiring portions and the outer peripheral surface of the power amplifier, and the second main surface of the power amplifier is exposed from the second resin layer and is in contact with the first shield portion.

12. The radio frequency module according to claim 11, wherein each of the plurality of rewiring portions has a pad to which a corresponding conductor member among the plurality of conductor members is connected, and in plan view from the thickness direction of the mounting board, the pad of each of the plurality of conductor members is larger than a connection area with the conductor member that is connected to the pad, among the plurality of conductor members.

13. The radio frequency module according to claim 11, further comprising:

a controller that controls the power amplifier; and a plurality of second conductor members that are different from a plurality of first conductor members, which are the plurality of conductor members, and that connect the controller and the mounting board, wherein the controller has a third main surface and a fourth main surface that face each other, and a plurality of second terminals that are different from a plurality of first terminals which are the plurality of terminals, and is spaced apart from the main surface of the mounting board in the thickness direction of the mounting board and the fourth main surface is in contact with the first shield portion.

14. The radio frequency module according to claim 13, further comprising:

a wiring portion that is disposed on the main surface of the first resin layer and connects the power amplifier and the controller.

15. The radio frequency module according to claim 10, further comprising:

a second electronic component that is disposed on the main surface of the mounting board and is adjacent to a first electronic component which is the electronic component, wherein the resin layer covers the second electronic component, the mounting board includes a ground layer, the plurality of conductor members includes a ground conductor member that is connected to the ground layer, and in plan view from the thickness direction of the mounting board, the ground conductor member is located between the first electronic component and the second electronic component.

16. The radio frequency module according to claim 10, further comprising:

a controller that controls the power amplifier, wherein the controller is disposed on a second main surface facing a first main surface which is the main surface in the mounting board, and the power amplifier and the controller overlap each other in plan view from the thickness direction of the mounting board.

17. The radio frequency module according to claim 16, wherein in plan view from the thickness direction of the mounting board, some conductor members among the plurality of conductor members and a part of the controller overlap each other.

18. A communication device comprising:

the radio frequency module according to claim 1; and a signal processing circuit that is connected to the radio frequency module.

19. A communication device comprising:

the radio frequency module according to claim 2; and a signal processing circuit that is connected to the radio frequency module.

20. A communication device comprising:

the radio frequency module according to claim 5; and a signal processing circuit that is connected to the radio frequency module.

* * * * *